United States Patent

(12) United States Patent
Ebata

(10) Patent No.: US 9,438,260 B1
(45) Date of Patent: Sep. 6, 2016

(54) SEMICONDUCTOR APPARATUS AND CALIBRATION METHOD FOR ANALOG TO DIGITAL CONVERTER

(71) Applicant: Renesas Electronics Corporation, Tokyo (JP)

(72) Inventor: Tomohiko Ebata, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/012,889

(22) Filed: Feb. 2, 2016

(30) Foreign Application Priority Data

Mar. 31, 2015 (JP) ................................. 2015-070502

(51) Int. Cl.
H03M 1/00 (2006.01)
H03M 1/10 (2006.01)

(52) U.S. Cl.
CPC ........... *H03M 1/1009* (2013.01); *H03M 1/001* (2013.01)

(58) Field of Classification Search
CPC .. H03M 1/001; H03M 1/1009; H03M 1/167; H03M 1/1057
USPC ................................................ 341/110–155
See application file for complete search history.

(56) References Cited

U.S. PATENT DOCUMENTS

| 5,274,377 | A | * | 12/1993 | Matsuura | H03M 1/069 |
| | | | | | 341/156 |
| 6,366,230 | B1 | * | 4/2002 | Zhang | H03M 1/167 |
| | | | | | 341/155 |
| 6,486,807 | B2 | | 11/2002 | Jonsson | |
| 7,002,506 | B1 | * | 2/2006 | Tadeparthy | H03M 1/0607 |
| | | | | | 327/94 |
| 8,831,074 | B2 | * | 9/2014 | Agazzi | H03M 1/804 |
| | | | | | 375/219 |
| 9,154,146 | B1 | * | 10/2015 | Chiu | H03M 1/002 |
| 2006/0208933 | A1 | * | 9/2006 | Chen | H03M 1/1004 |
| | | | | | 341/120 |
| 2009/0185613 | A1 | * | 7/2009 | Agazzi | H03M 1/0626 |
| | | | | | 375/232 |
| 2009/0243901 | A1 | * | 10/2009 | Abe | H03M 1/0604 |
| | | | | | 341/118 |
| 2009/0243907 | A1 | * | 10/2009 | Nazemi | H03M 1/1042 |
| | | | | | 341/161 |
| 2011/0169678 | A1 | * | 7/2011 | Wang | H03M 1/0602 |
| | | | | | 341/144 |
| 2013/0033391 | A1 | * | 2/2013 | Liu | H03M 1/804 |
| | | | | | 341/150 |
| 2013/0038483 | A1 | * | 2/2013 | Liu | H03M 1/147 |
| | | | | | 341/161 |
| 2014/0320323 | A1 | * | 10/2014 | Zhu | H03M 1/164 |
| | | | | | 341/122 |

FOREIGN PATENT DOCUMENTS

JP 4532808 B2 8/2010

* cited by examiner

*Primary Examiner* — Lam T Mai
(74) *Attorney, Agent, or Firm* — Mattingly & Malur, PC

(57) ABSTRACT

In a conventional calibration method of an analog to digital converter, it has been difficult to easily derive a plurality of correction coefficients. A semiconductor apparatus according to an embodiment includes a plurality of unit elements that are provided to correspond to the total number of weights for each bit of the digital intermediate value b[1:0] output from a sub ADC, and the same capacitance, the same resistance value, or the same current value being set to the plurality of unit elements. Further included is a corresponding bit switching unit configured to switches the bits of the digital intermediate value based on which the plurality of unit elements generate analog values. At the time of calibration, combinations of the plurality of unit elements and the bits are rotated, and correction coefficients are derived by digital intermediate values obtained according to each combination.

11 Claims, 23 Drawing Sheets

FLASH ADC

SUCCESSIVE APPROXIMATION ADC

|  | Vrefb0 | Vrefb1 | Vrefb2 | | | |
|---|---|---|---|---|---|---|
| Formation1 | Cs1 | Cs2 | Cs3 | Cs4 | Cs5 | Cs6 | Cs7 |
| Formation2 | Cs2 | Cs3 | Cs4 | Cs5 | Cs6 | Cs7 | Cs1 |
| Formation3 | Cs3 | Cs4 | Cs5 | Cs6 | Cs7 | Cs1 | Cs2 |
| Formation4 | Cs4 | Cs5 | Cs6 | Cs7 | Cs1 | Cs2 | Cs3 |
| Formation5 | Cs5 | Cs6 | Cs7 | Cs1 | Cs2 | Cs3 | Cs4 |
| Formation6 | Cs6 | Cs7 | Cs1 | Cs2 | Cs3 | Cs4 | Cs5 |
| Formation7 | Cs7 | Cs1 | Cs2 | Cs3 | Cs4 | Cs5 | Cs6 |
| Formation8 | Cs2 | Cs3 | Cs1 | Cs4 | Cs5 | Cs6 | Cs7 |
| Formation9 | Cs3 | Cs1 | Cs2 | Cs4 | Cs5 | Cs6 | Cs7 |

Fig. 10

SEMICONDUCTOR APPARATUS AND CALIBRATION METHOD FOR ANALOG TO DIGITAL CONVERTER

CROSS-REFERENCE TO RELATED APPLICATIONS

This application is based upon and claims the benefit of priority from Japanese patent application No. 2015-070502, filed on Mar. 31, 2015, the disclosure of which is incorporated herein in its entirety by reference.

BACKGROUND

The present invention relates to a semiconductor apparatus and to, for example, a semiconductor apparatus including an analog to digital converter and a calibration method for an analog to digital converter.

In recent years, in many cases, a voltage value of an analog signal obtained from a sensor element is converted into a digital value to be processed by software operating on a microcomputer or the like or by a signal processing circuit or the like that is comprised of a digital circuit. An analog to digital converter is used for the conversion of the analog value into the digital value. In this analog to digital converter, there is a problem that variations or the like in circuit elements that constitute the circuit may cause a conversion error. In order to improve an accuracy of the analog to digital converter, the conversion error needs to be eliminated. Thus, Japanese Patent No. 4532808 discloses an example of an error correction in an analog to digital converter.

In the technique disclosed in Japanese Patent No. 4532808, a sub ADC (Analog to Digital Converter) for converting an input signal into a digital value and a sub DAC (Digital to Analog Converter) for converting an output value of the sub ADC into an analog value are included, and device elements for generating the analog value corresponding to the digital value in the sub DAC are grouped into two groups, namely, + group and − group. Then, from a difference between a result of the analog to digital conversion in which the device elements which are to be corrected (segment i) are grouped into the + group and a result of the analog to digital conversion in which the segment i is grouped into the − group, a weight of the segment i is calculated.

SUMMARY

In the technique disclosed in Japanese Patent No. 4532808, a correction coefficient to be calculated is only the weight of the segment i. However, the present inventor has found a problem that when there are a plurality of correction coefficients to be calculated, a highly accurate analog to digital converter for calibration needs to be added in the technique disclosed in Japanese Patent No. 4532808. Other problems of the related art and new features of the present invention will become apparent from the following descriptions of the specification and attached drawings.

An aspect of the present invention is a semiconductor apparatus that includes: a plurality of unit elements provided to correspond to the total number of weights for each bit of the digital intermediate value output from a sub ADC, in which the same capacitance, the same resistance value, or the same current value are set to the plurality of unit elements; and a corresponding bit switching unit configured to switches the bits of the digital intermediate value based on which the plurality of unit elements generate analog values.

At the time of calibration, combinations of the plurality of unit elements and the bits are rotated, and correction coefficients are derived by digital intermediate values obtained according to each combination.

Note that implementations of the apparatus according to the above-mentioned aspect in the form of a system and a method, a program for causing a computer to execute processing or a part of the processing of the apparatus, an imaging apparatus including the apparatus and the like may also be effective as aspects of the present invention.

According to the above aspect, it is possible to calculate a plurality of correction coefficients by a simple calculation and speed up a calibration operation.

BRIEF DESCRIPTION OF THE DRAWINGS

The above and other aspects, advantages and features will be more apparent from the following description of certain embodiments taken in conjunction with the accompanying drawings, in which:

FIG. 10 is a table for explaining a rotation of unit elements in the analog to digital converter according to the second embodiment;

DETAILED DESCRIPTION

Figure 1:
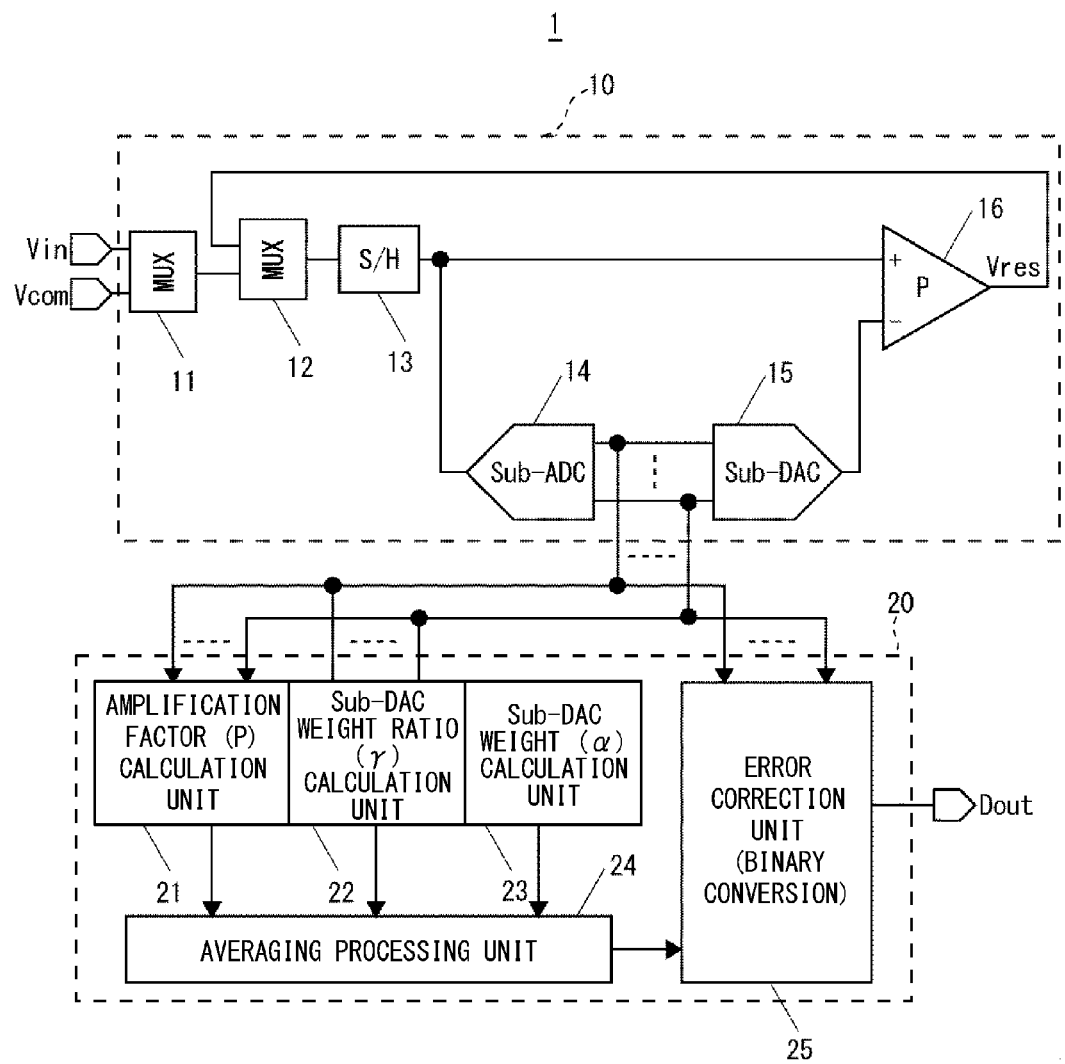
FIG. 1 is a block diagram of an analog to digital converter according to a first embodiment.

To clarify the explanation, some parts thereof and some of the drawings have been omitted and simplified as appropriate. Further, the elements illustrated in the drawings as functional blocks for performing various processes can be implemented hardware-wise by a CPU, a memory, and other circuits, and software-wise by a program loaded onto a memory or the like. Accordingly, it is to be understood by those skilled in the art that these functional blocks can be implemented in various forms including, but not limited to, being implemented by hardware alone, software alone, or a combination of hardware and software. Note that in the drawings, the same elements are denoted by the same reference numerals, and repeated descriptions are omitted as needed.

Further, the above-mentioned program can be stored and provided to a computer using any type of non-transitory computer readable media. Non-transitory computer readable media include any type of tangible storage media. Examples of non-transitory computer readable media include magnetic storage media (such as floppy disks, magnetic tapes, hard disk drives, etc.), optical magnetic storage media (e.g. magneto-optical disks), CD-ROM (Read Only Memory), CD-R, CD-R/W, and semiconductor memories (such as mask ROM, PROM (programmable ROM), EPROM (Erasable PROM), flash ROM, RAM (Random Access Memory), etc.). The program may be provided to a computer using any type of transitory computer readable media. Examples of transitory computer readable media include electric signals, optical signals, and electromagnetic waves. Transitory computer readable media can provide the program to a computer via a wired communication line (e.g. electric wires, and optical fibers) or a wireless communication line.

FIG. 1 is a block diagram of an analog to digital converter 1 according to a first embodiment. As shown in FIG. 1, the analog to digital converter 1 according to the first embodiment includes an analog unit 10 and a digital unit 20. The analog unit 10 includes a circuit for converting an analog signal into a digital signal. The digital unit 20 is an output stage circuit for correcting a digital value output from the analog unit 10 and outputting final converted data.

The analog unit 10 includes a selector 11, a selector 12, a sample hold circuit 13, a sub ADC (Analog to Digital Converter) 14, a sub DAC (Digital to Analog Converter) 15, and a residue amplifier 16. The analog unit 10 according to the first embodiment includes a cyclic analog to digital converter. The selector 11 selects one of an analog signal Vin and a common voltage Vcom and transmits the selected signal to the selector 12 which is a stage subsequent to the selector 11. A calibration control unit not shown in FIG. 1 instructs the selector 11 to select which one of these signals to select. The selector 12 selects one of the signal output from the selector 11 and a residue voltage Vres output from the residue amplifier 16 and outputs the selected one of the signal output from the selector 11 and a residue voltage Vres output from the residue amplifier 16 to the sample hold circuit 13. An analog to digital conversion control circuit not shown in FIG. 1 instructs the selector 12 to select which one of these signals to select. Note that the analog to digital conversion control circuit controls an operation for converting the analog signal into the digital signal and various switch timings in operation of each block inside the digital unit 20.

The sample hold circuit 13 samples a voltage level of the signal output from the selector 12, holds the sampled value, and outputs the sampled value to a circuit in a subsequent stage. The sub ADC 14 outputs a digital intermediate value corresponding to a signal level of an input signal as a multi-bit digital value b[x:0]. To be more specific, the sub ADC 14 converts an analog voltage output from the sample hold circuit 13 into an x-bit digital intermediate value corresponding to a voltage value of the analog voltage. Note that x indicates the number of bits of the digital intermediate value output from the sub ADC 14 and is a value of one or greater.

The sub DAC 15 outputs an analog intermediate value corresponding to the digital intermediate value. More specifically, the sub DAC 15 outputs an analog voltage that corresponds to a value obtained by multiplying the digital intermediate value output from the sub ADC 14 by a predetermined reference voltage (e.g. VrefH and VrefL). The sub DAC 15 includes a corresponding bit switching unit, a plurality of unit elements, and a calibration control unit, details of which shall be explained later. The plurality of unit elements are provided to correspond to the total number of a weight of each bit of the digital intermediate value. The plurality of unit elements are set to have the same capacity, the same resistance value, or the same current value. The corresponding bit switching unit switches the bits of the digital intermediate value based on which each of the plurality of unit elements generates an analog value. The calibration control unit switches combinations of the unit elements and the bits used by the unit elements to generate the analog value at the time of a calibration operation.

The residue amplifier 16 amplifies a difference between the voltage output from the sample hold circuit 13 and the voltage output from the sub DAC 15 by an amplification factor P and outputs a residue signal Vres. The analog to digital converter comprised of the sample hold circuit 13, the sub ADC 14, the sub DAC 15, and the residue amplifier 16 shall be referred to as a Multiplying Digital to Analog Converter (hereinafter referred to as an MDAC).

The digital unit 20 is the output stage circuit. The output stage circuit outputs a digital output value (e.g. output data Dout) that is generated by correcting the digital intermediate value by a correction coefficient. Further, the output stage circuit obtains the digital intermediate value for each combination of the unit element and the reference voltage at the time of the calibration operation and calculates the correction coefficient (e.g. the amplification factor P, a weight ratio γ, and a weight α) according to the obtained digital intermediate value. The digital unit 20 includes an amplification factor calculation unit 21, a weight ratio calculation unit 22, a weight calculation unit 23, an averaging processing unit 24, and an error correction unit 25. The amplification factor calculation unit 21 calculates the amplification factor P of the residue amplifier 16. The weight ratio calculation unit 22 calculates the weight ratio γ of the sub DAC 15. The weight calculation unit 23 calculates the weight α of the sub DAC 15. The averaging processing unit 24 averages an influence of noise of the values calculated by the amplification factor calculation unit 21, the weight ratio calculation unit 22, and the weight calculation unit 23. The amplification factor calculation unit 21 outputs the averaged values to the error correction unit 25. The error correction unit 25 corrects an error of the digital value output from the sub ADC 14 using the amplification factor P, the weight ratio γ, and the weight α that are obtained from the averaging processing unit 24 and outputs the final output data Dout. Further, the output data Dout output from the error correction unit 25 is a binary digit, and the error correction unit 25 has a function to convert non-binary data into a binary digit.

In the analog to digital converter 1 according to the first embodiment, the amplification factor P, the weight ratio γ, and the weight α are calculated according to the calibration operation. Details of this calibration operation shall be described later.

Figure 2:
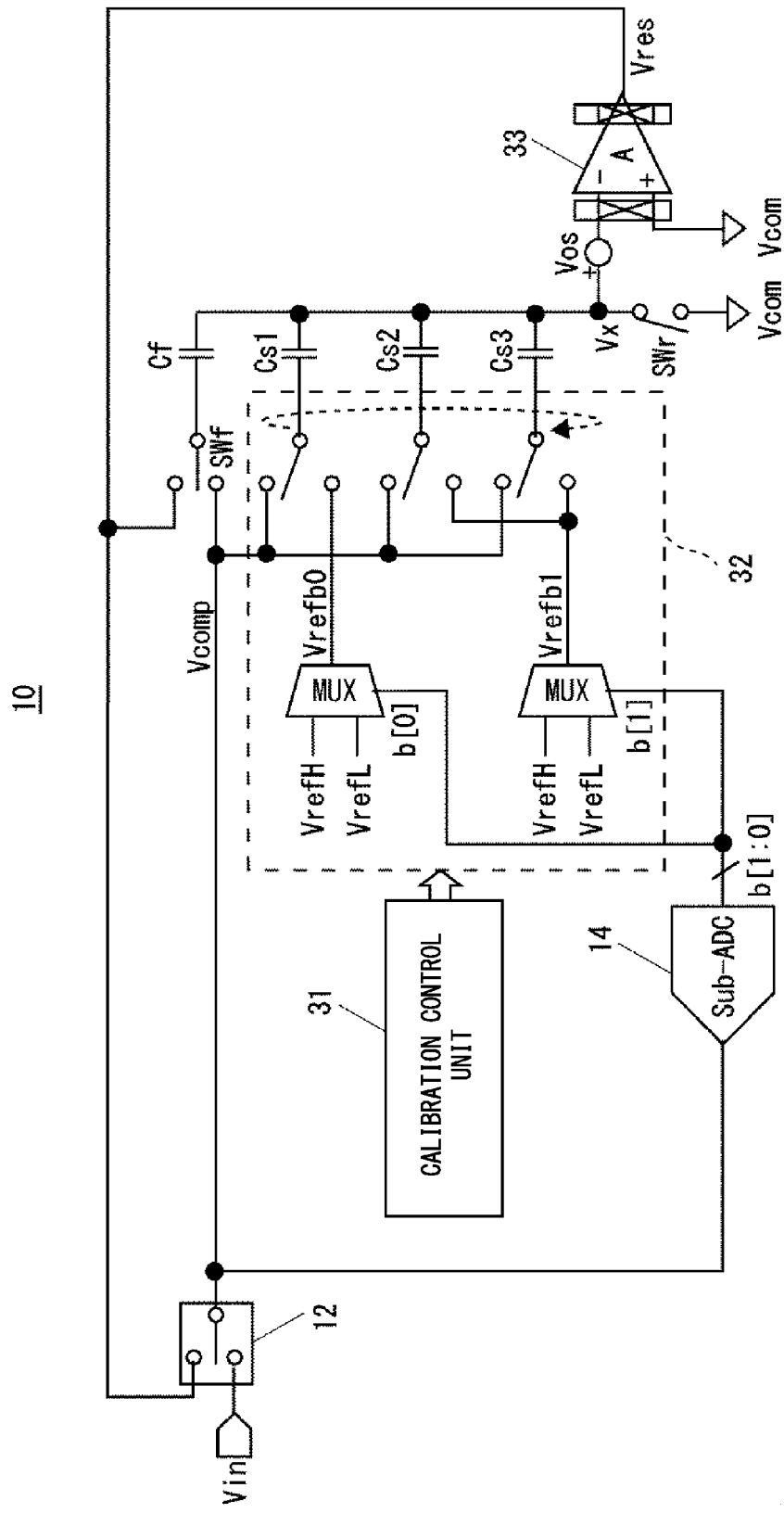
FIG. 2 is a block diagram of an analog unit of the analog to digital converter according to the first embodiment.

Next, FIG. 2 is a detailed block diagram of the analog unit 10 according to the first embodiment. FIG. 2 shows an example in which the sub ADC 14 outputs a two-bit digital intermediate value. As shown in FIG. 2, the analog unit 10 includes the selector 12, the sub ADC 14, a calibration control unit 31, the corresponding bit switching unit 32, a feedback capacitor Cf, sampling capacitors Cs1 to Cs3, switches SWf and SWr, and an amplifier 33. In the analog to digital converter shown in FIG. 2, the corresponding bit switching unit 32, the amplifier 33, the feedback capacitor Cf, and the sampling capacitors Cs1 to Cs3 constitute the sample hold circuit 13, the sub DAC 15, and the residue amplifier 16. Further, the sampling capacitors Cs1 to Cs3 are the unit elements. That is, the analog unit 10 according to the first embodiment includes a switched capacitor DAC. Note that the selector 11 is not shown in FIG. 2. Moreover, an offset voltage Vos of the amplifier 33 is shown as an input to the amplifier 33. Preferably, the amplifier 33 performs a chopping operation for switching a forward input terminal and a reverse input terminal and switching a forward output terminal and a reverse output terminal to thereby remove an influence of the offset voltage Vos on a result of the conversion.

The selector 12 has been explained by referring to FIG. 1. The sub ADC 14 outputs the digital intermediate value b[x:0] corresponding to the voltage level of the signal selected by the selector 12. For example, a flash ADC or a successive approximation ADC can be used for the sub ADC 14. Examples of the flash ADC and the successive approximation ADC are shown in FIG. 3.

Figure 3:
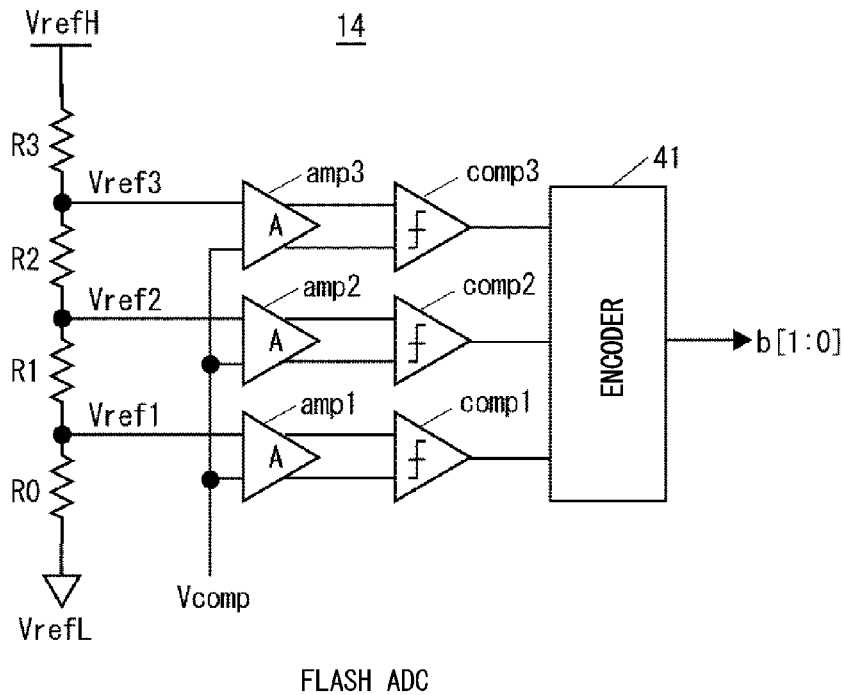
FIG. 3 is a block diagram showing an example of a sub ADC according to the first embodiment.
Figure 3:
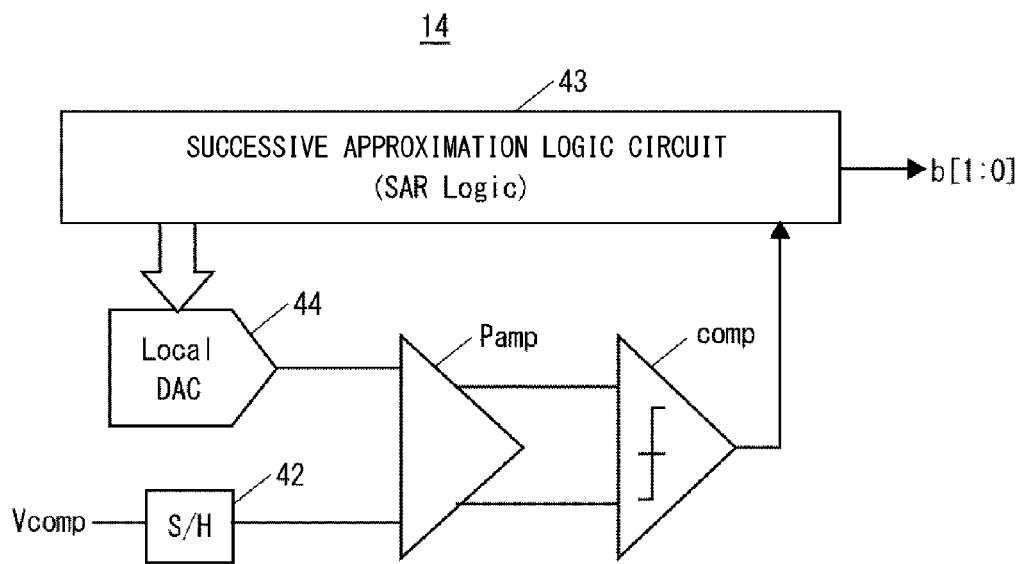

In FIG. 3, a block diagram of the flash ADC is shown in the upper drawing, and a block diagram of the successive approximation ADC is shown in the lower drawing. The flash ADC generates a plurality of reference voltages Vref1 to Vref3 by a resistor string in which a plurality of resistors are connected in series between an upper reference voltage line supplied with a high potential reference voltage VrefH and a lower reference voltage line supplied with a low potential reference voltage VrefL. Then, amplifiers amp1 to amp3 amplify errors between the reference voltages Vref1 to Vref3 and an input signal Vcomp, respectively. Next, comparators comp1 to comp3 evaluate sizes of the amplified errors. In the flash ADC, results of the evaluation output from the comparators comp1 to comp3 are encoded into an x-bit (e.g. two-bit) digital intermediate value by an encoder 41.

The successive approximation ADC includes a sample hold circuit 42, a preamplifier Pamp, a comparator comp, a successive approximation logic circuit 43, and a local DAC 44. In the successive approximation ADC, the sample hold circuit 42 holds a voltage level of an input signal Vcomp. Further, in the successive approximation ADC, the local DAC 44 generates a reference voltage of a current cycle according to a value output from the comparator comp in a previous cycle. Then, the preamplifier Pamp amplifies a voltage difference between a voltage output from the sample hold circuit 42 and the reference voltage output from the local DAC 44. The comparator comp evaluates a magnitude relation of the voltage output from the sample hold circuit 42 and the reference voltage output from the local DAC 44 according to an output from the preamplifier Pamp. The successive approximation logic circuit 43 supplies a digital value which will be the reference voltage in the next cycle to the local DAC 44 according to an output from the comparator comp. Further, the successive approximation logic circuit 43 outputs an x-bit (e.g. two-bit) digital intermediate value according to the output from the comparator comp.

In the analog unit 10, the sampling capacitors Cs1 to Cs3 are the unit elements. The amplification factor P of the residue amplifier including the amplifier 33 is determined according to a capacitance ratio between a combined capacitance of the sampling capacitors and the feedback capacitor Cf. Moreover, in the analog unit 10, a switch inside the corresponding bit switching unit 32 is connected to a terminal side to which the input signal Vcomp is transmitted, a voltage value of the input signal Vcomp is sampled to the sampling capacitors Cs1 to Cs3, and the switch SWf is connected to a terminal to which the residue signal Vres is transmitted to thereby connect the feedback capacitor Cf between an output terminal and an input terminal of the amplifier 33 in order to perform a sampling operation. Note that during the sampling operation, the switch SWr is in a connected state. Furthermore, in the analog unit 10, a switch connected to one ends of the sampling capacitors Cs1 to Cs3 is connected to the reference voltage side, the switch SWf is connected to the input signal Vcomp side, and the switch SWr is blocked so as to perform the conversion process from the analog signal into the digital signal. In this conversion process, the corresponding bit switching unit 32 supplies the sampling capacitors Cs1 to Cs3 with the reference voltage corresponding to the digital intermediate value output from the sub ADC 14.

The corresponding bit switching unit 32 outputs reference voltages Vrefb0 and Vrefb1 for each bit of the digital intermediate value b[1:0], in which the number of the reference voltages corresponds to the weight of the bit, and switches voltages of the reference voltages between a first reference voltage (e.g. the high potential reference voltage VrefH) and a second reference voltage (e.g. the low potential reference voltage VrefL) according to the value of each bit. That is, the corresponding bit switching unit 32 switches the bits of the digital intermediate value b[1:0] based on which the sampling capacitors Cs1 to Cs3 generate the analog values according to the selected reference voltage. Then, the calibration control unit 31 switches combinations of the unit elements and the bits in such a way that each of the plurality of unit elements is combined with all bits of the digital intermediate value b[1:0]. To be more specific, the calibration control unit 31 switches the combinations of the unit elements and the reference voltages in such a way that each of the plurality of unit elements is combined with all of the plurality of reference voltages that are output from the corresponding bit switching unit 32. An operation of switching the combinations of the unit elements and the bits shall be hereinafter referred to as a rotation operation.

The analog to digital converter 1 according to the first embodiment performs the rotation operation at the time of the calibration and calculates the plurality of correction coefficients according to the results of conversion of the common voltage Vcom that is obtained for each combination of the unit element and the reference voltage generated in the rotation operation. Thus, the rotation operation by the analog unit 10 according to the first embodiment shall be explained first.

Figure 4:
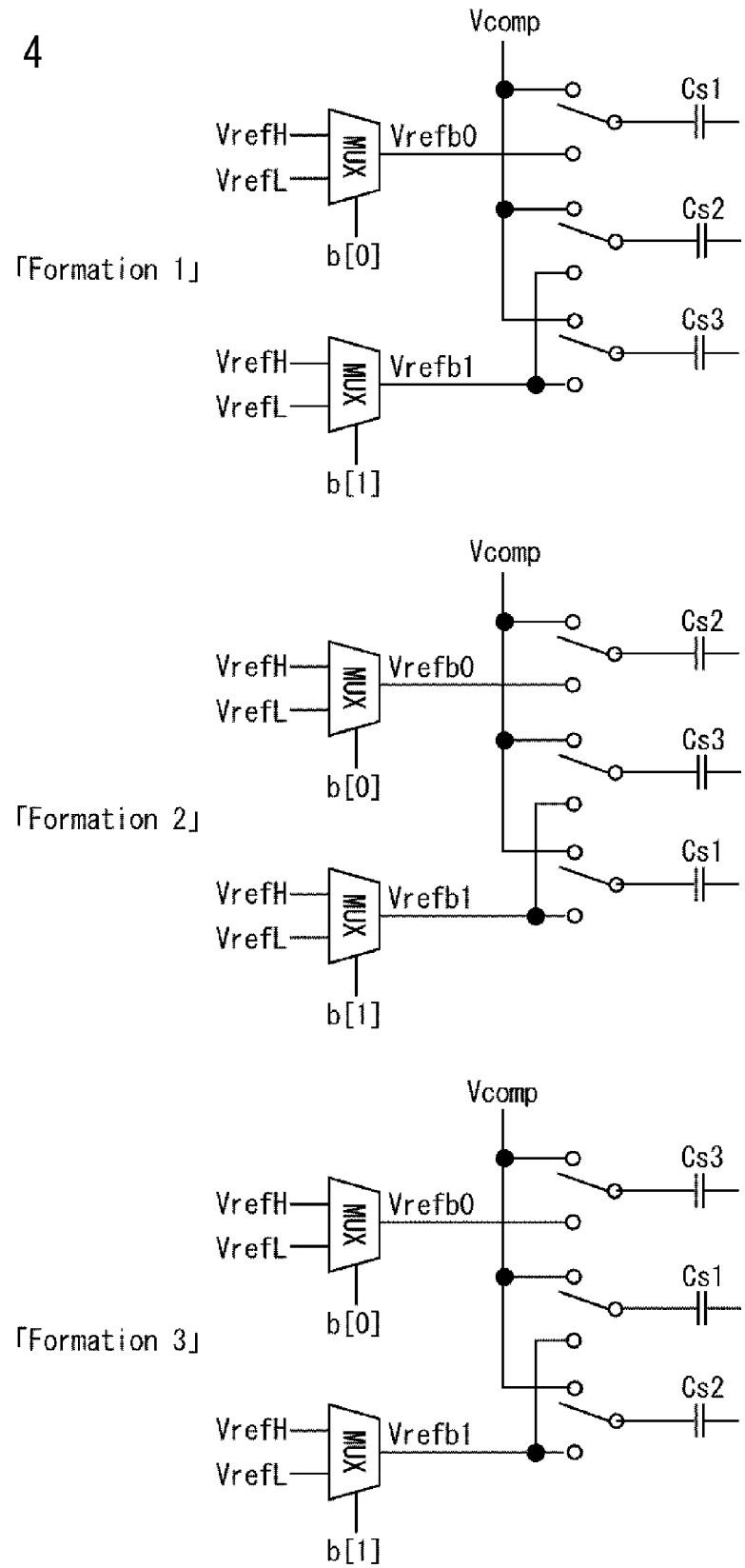
FIG. 4 is a drawing for explaining a rotation of unit elements in the analog to digital converter according to the first embodiment.

FIG. 4 is a drawing for explaining a rotation of the unit elements in the analog to digital converter according to the first embodiment. In the analog unit 10 according to the first embodiment shown in FIG. 2, the digital intermediate value is two bits. Therefore, in the analog unit 10, a weight ratio between a first bit of the digital intermediate value b[0] and a second bit digital intermediate value b[1] is 1:2. Accordingly, the corresponding bit switching unit 32 outputs one reference voltage Vrefb0, in which the voltage of the reference voltage Vrefb0 is switched according to the value of the first bit of the digital intermediate value, and two reference voltages Vrefb1, in which the voltage of the reference voltage Vrefb1 is switched according to the value of the second bit of the digital intermediate value.

Then, the analog unit 10 according to the first embodiment performs the rotation operation so that three reference voltages, namely, one reference voltage Vrefb0 and two reference voltages Vrefb1 are provided to each of the sampling capacitors Cs1 to Cs3 to thereby switch the combinations of the sampling capacitors Cs1 to Cs3 and the bits. More specifically, the analog unit 10 switches topologies of formations 1 to 3 shown in FIG. 4 by the rotation operation.

In the formation 1, the reference voltage Vrefb0 is supplied to the sampling capacitor Cs1, and the reference voltage Vrefb1 is supplied to the sampling capacitors Cs2 and Cs3. In the formation 2, the reference voltage Vrefb0 is supplied to the sampling capacitor Cs2, and the reference voltage Vrefb1 is supplied to the sampling capacitors Cs1 and Cs3. In the formation 3, the reference voltage Vrefb0 is supplied to the sampling capacitor Cs3, and the reference voltage Vrefb1 is supplied to the sampling capacitors Cs1 and Cs2.

As a method for performing the above-mentioned rotation operation, there are: an analog method that switches the reference voltages which will be supplied to the sampling capacitors by a switch provided between the sampling capacitors and the selectors; and a digital method that switches the bits of the digital intermediate value which will be supplied to the selectors for switching voltage values of the reference voltages. A circuit configuration for performing the rotation operation shall be explained as follows.

Figure 5:
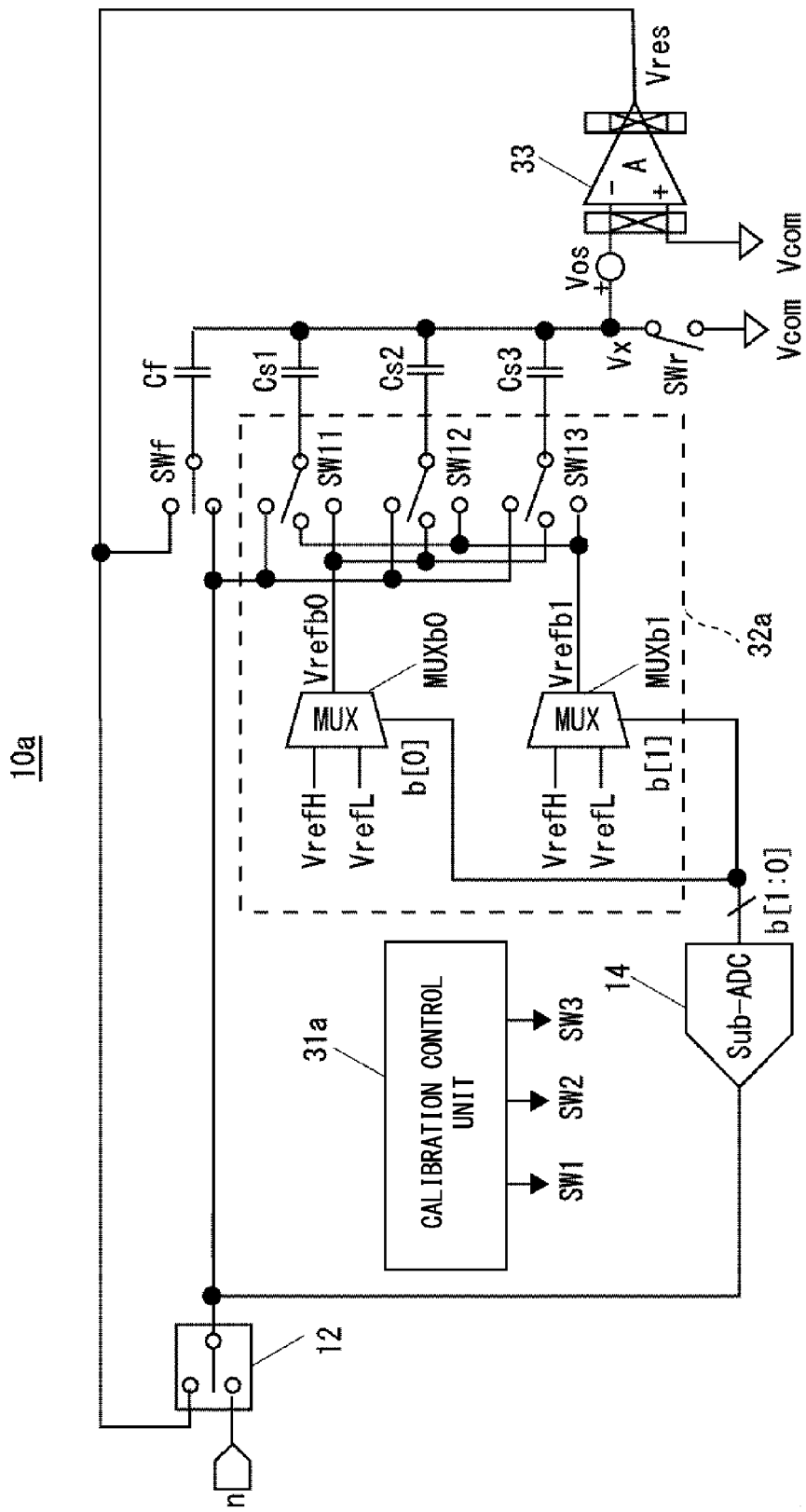
FIG. 5 is a block diagram showing an example of a circuit that realizes the rotation of the unit elements in the analog to digital converter according to the first embodiment.

FIG. 5 is a block diagram of an analog unit 10a that employs the analog method as an example of a circuit that realizes the rotation of the unit elements in the analog to digital converter according to the first embodiment.

As shown in FIG. 5, in the analog unit 10a that employs a rotation circuit of the analog method, a corresponding bit switching unit 32a includes a selector MUXb0 corresponding to the first bit of the digital intermediate value b[0] and a selector MUXb1 corresponding to the second bit of the digital intermediate value b[1]. Further, switches SW11 to SW13 for switching voltages to be supplied to the sampling capacitors Cs1 to Cs3 are provided in the corresponding bit switching unit 32a. The calibration control unit 31a outputs a switch control signal switching signal for switching connection destinations of the switches SW11 to SW13. Then, the switch SW11 supplies one of the input signal Vcomp and the reference voltages Vrefb0 and Vrefb1 to the sampling capacitor Cs1. The switch SW12 supplies one of the input signal Vcomp and the reference voltages Vrefb0 and Vrefb1 to the sampling capacitor Cs2. The switch SW13 supplies one of the input signal Vcomp and the reference voltages Vrefb0 and Vrefb1 to the sampling capacitor Cs3.

That is, when the rotation operation is performed using the circuit of the analog method, the corresponding bit switching unit 32a includes a plurality of selection circuits (e.g. the selectors MUXb0 and MUXb1) and a plurality of switch circuits (e.g. the switch circuits SW11 to SW13). The number of the plurality of selection circuits provided is the same as that of the bits of the digital intermediate value. Each of the plurality of selection circuits selects the first reference voltage (e.g. the high potential reference voltage VrefH) and the second reference voltage (e.g. the low potential reference voltage VrefL) according to one of the bits of the digital intermediate value and outputs the selected voltages as the reference voltage. Further, the number of the switch circuits provided is the same as that of the unit elements. Each of the plurality of switch circuits selects one reference voltage output from the selectors MUXb0 and MUXb1. When the rotation operation is performed using the circuit of the analog method, the calibration control unit 31a outputs a switch control signal that controls each of the switch circuits SW11 to SW13 to select all the reference voltages output from the selector MUXb0 and MUXb1 at least once.

Figure 6:
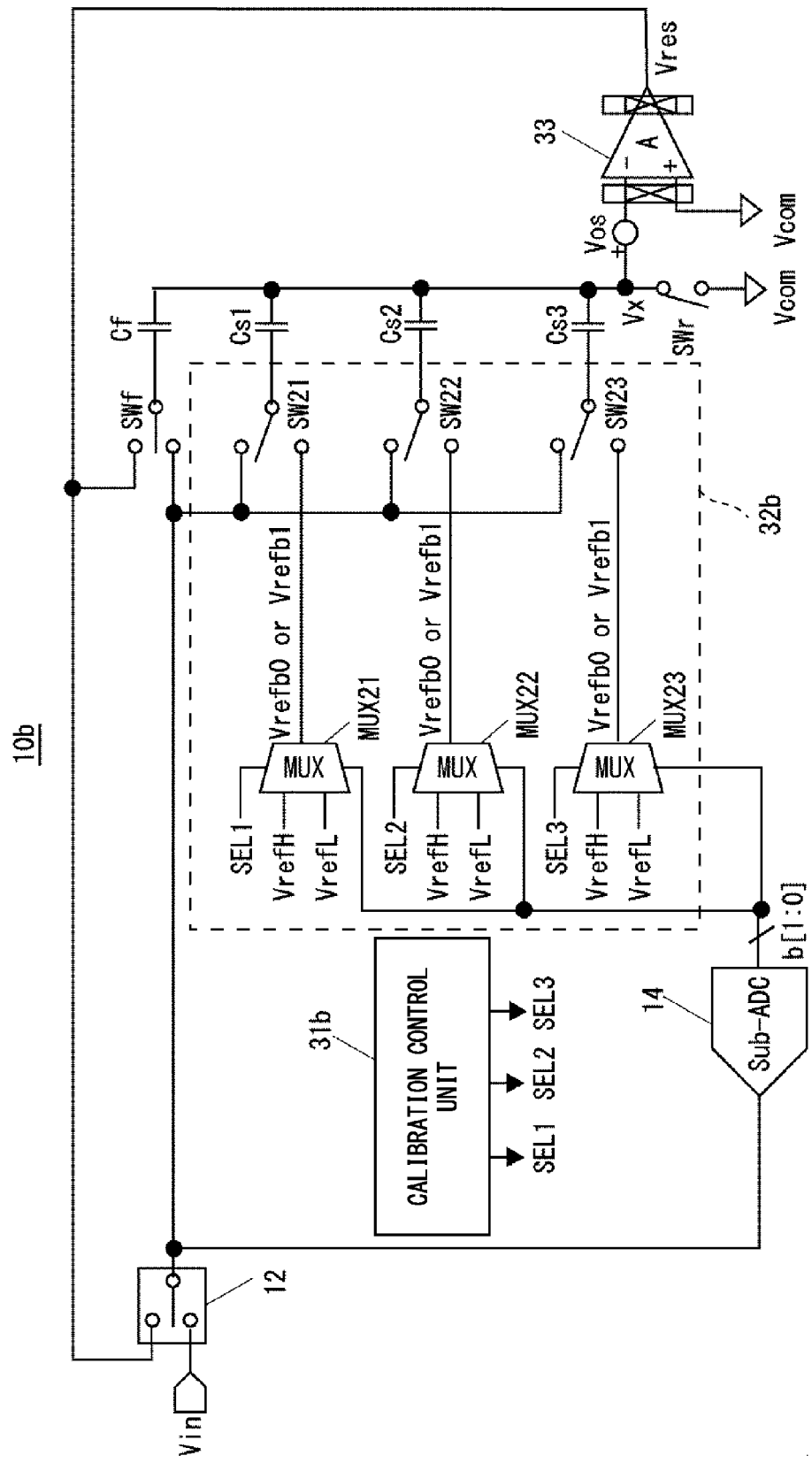
FIG. 6 is a block diagram showing another example of the circuit that realizes the rotation of the unit elements in the analog to digital converter according to the first embodiment.

Next, FIG. 6 is a block diagram showing an analog unit 10b that employs the digital method as an example of the circuit that realizes the rotation of the unit elements in the analog to digital converter according to the first embodiment.

In the analog unit 10b that employs the rotation circuit of the digital method, a corresponding bit switching unit 32b includes selectors MUX21 to MUX23 corresponding the sampling capacitors Cs1 to Cs3, respectively. Further, switches SW21 to SW23 are provided between the sampling capacitors Cs1 to Cs3 and the selectors MUX21 to MUX23, respectively. Selection signal switching signals SEL1 to SEL3 are supplied to the selectors MUX21 to MUX23, respectively. Then, the selectors MUX21 to MUX23 switch the bits of the digital intermediate value for selecting the voltages of the reference voltages according to the input selection signal switching signals. For example, the selector MUX21 switches, according to the selection signal switching signal SEL1, as to whether to select the voltage of the reference voltage Vrefb0 that is output according to the first bit of the digital intermediate value b[0] or to select the voltage of the reference voltage Vrefb1 according to the second bit of the digital intermediate value b[1]. Further, the switches SW21 to SW23 transmit one of the input signal Vcomp and the reference voltage to the sampling capacitors Cs1 to Cs3 by an analog to digital conversion control circuit not shown.

That is, when the rotation operation is performed by the circuit of the digital method, the corresponding bit switching unit 32b includes the selectors MUX21 to MUX23 for selecting the first reference voltage (e.g. the high potential reference voltage VrefH) and the second reference voltage (e.g. the low potential reference voltage VrefL) according to one of the bits of the digital intermediate value and outputs the selected voltages as the reference voltage. Note that the number of the selectors MUX21 to MUX23 is the same as that of the unit elements. Moreover, the calibration control unit 32b supplies the selectors MUX21 to MUX23 with the selection signal switching signals SEL1 to SEL3 for instructing the selectors MUX21 to MUX23, respectively, to select the reference voltages according to all bit values from the first bit to the last bit of the digital intermediate value.

Next, an operation of the analog to digital converter 1 according to the first embodiment shall be explained as follows. Firstly, in the analog unit 10 of the analog to digital converter 1 according to the first embodiment, the same capacitance value is set to the unit elements (e.g. the sampling capacitors Cs1 to Cs3) inside the sub DAC 15. However, there are variations in the sampling capacitors Cs1 to Cs3, and the capacitance values will be deviated from an ideal value (the same capacitance). On the other hand, in the analog unit 10, in order to make the amplification factor P of the residue amplifier 16 become 2<P<4, the feedback capacitor Cf is set to have a capacitance value that is greater than the values of the sampling capacitors Cs1 to Cs3. When an amplification factor A of the amplifier 33 is ∞, the amplification factor P of the residue amplifier 16 is represented by P=(Cf+Cs1+Cs2+Cs3)/Cf.

When the amplification factor P of the residue amplifier 16 is 2<P<4, the digital intermediate value b[x:0] is represented by a non-binary digital value in a cyclic ADC or a pipeline ADC. By doing so, although the number of cycles and the number of pipeline stages will become greater than when the amplification factor P is four, redundancy can be obtained. As the redundancy can be obtained, the analog to digital converter 1 according to the first embodiment can correct an error in the sample hold circuit 13 or an offset voltage of the amplifier 33. Note that at the time of the calibration, the offset voltage Vos of the amplifier 33 may become a problem. Thus, it is preferable to remove the influence of the offset voltage Vos by appropriately applying the chopping technique.

Figure 7:
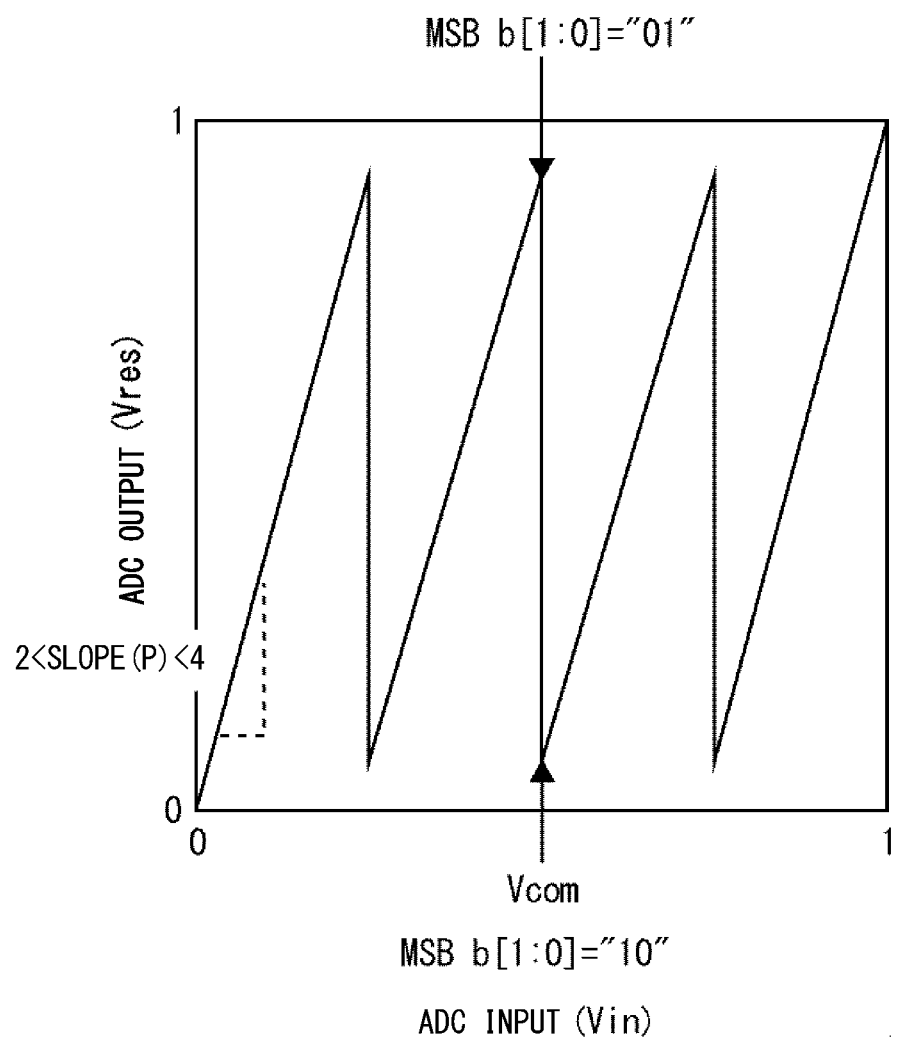
FIG. 7 is a graph for explaining a transmission characteristic of the analog to digital converter according to the first embodiment.

FIG. 7 shows a transmission characteristic of the analog to digital converter 1 according to the first embodiment. As shown in FIG. 7, in the analog to digital converter 1 according to the first embodiment, a slope of the residue signal Vres with respect to the input signal Vin will become the amplification factor P (e.g. 2<P<4). Further, the common voltage Vcom input at the time of the calibration includes a voltage value in which b[1:0] of the digital intermediate value corresponding to an MSB (Most Significant Bit) of the output data Dout is "01" or "10". The digital intermediate value corresponding to the MSB (Most Significant Bit) of the output data Dout shall be especially referred to as a most significant digital intermediate value.

Figure 8:
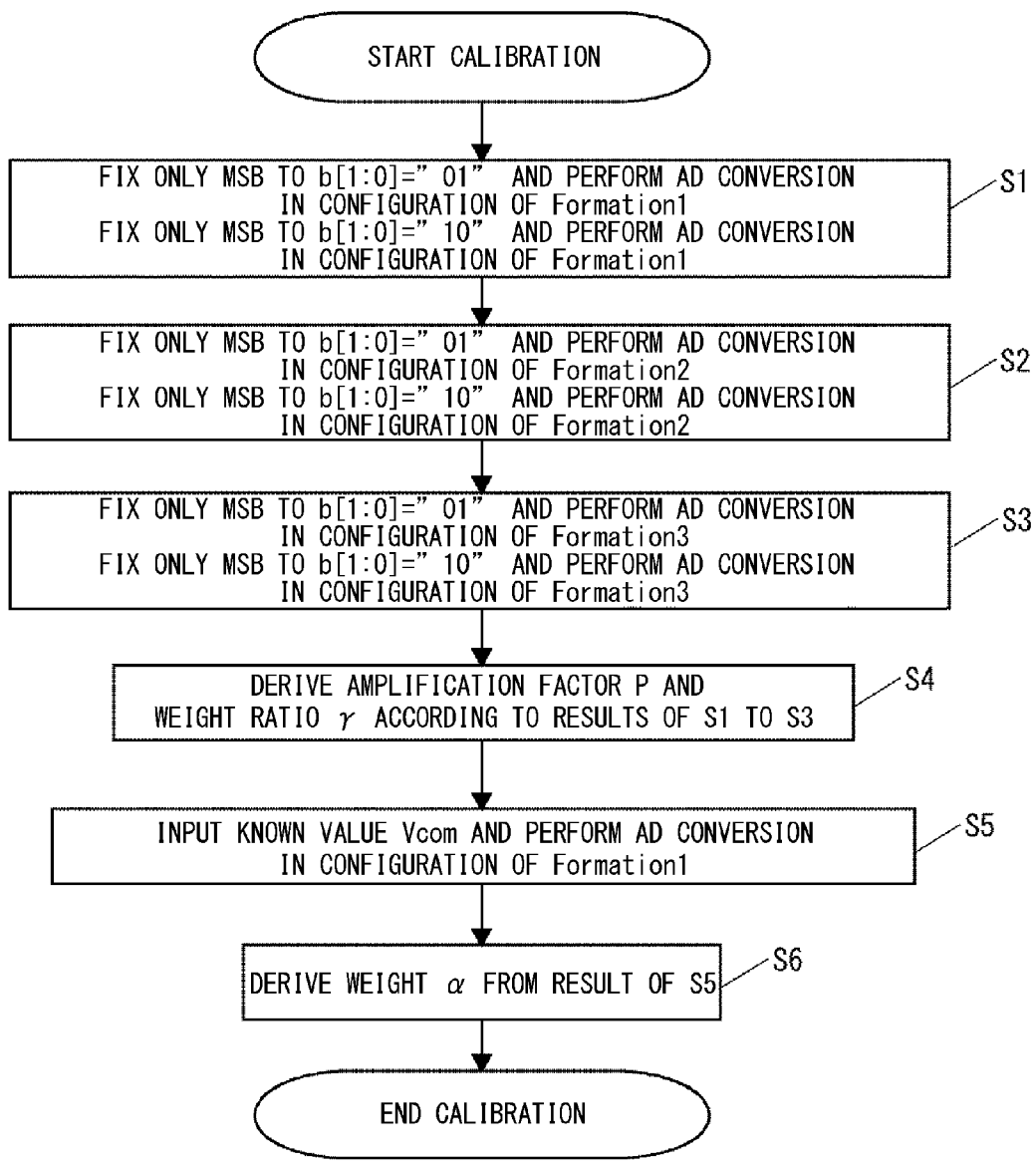
FIG. 8 is a flowchart of a calibration method of the analog to digital converter according to the first embodiment.

Next, a procedure of the calibration operation in the analog to digital converter 1 according to the first embodiment shall be explained. FIG. 8 is a flowchart of a calibration method of the analog to digital converter according to the first embodiment.

As shown in FIG. 8, in the analog to digital converter 1 according to the first embodiment, in the step S1, in the topology of the formation 1 shown in FIG. 4, an analog to digital conversion process in which the common voltage Vcom is input as the input signal Vin, and only a value corresponding to an MSB in the digital intermediate value b[1:0] that is output from the sub ADC 14 (e.g. the most significant digital intermediate value) is fixed to "01" is performed. Further, in the step S1, in the topology of the formation 1 shown in FIG. 4, an analog to digital conversion process in which the common voltage Vcom is input as the input signal Vin, and only the most significant digital intermediate value b[1:0] is fixed to "10" that is output from the sub ADC 14 is performed.

Next, in the analog to digital converter 1 according to the first embodiment, in the step S2, in the topology of the formation 2 shown in FIG. 4, an analog to digital conversion process in which the common voltage Vcom is input as the input signal Vin, and only the most significant digital intermediate value b[1:0] that is output from the ADC 14 is fixed to "01" is performed. Further, in the step S2, in the topology of the formation 2 shown in FIG. 4, an analog to digital conversion process in which the common voltage Vcom is input as the input signal Vin, and only the most significant digital intermediate value b[1:0] that is output from the sub ADC 14 is fixed to "01" is also performed.

Next, in the analog to digital converter 1 according to the first embodiment, in the step S3, in the topology of the formation 3 shown in FIG. 4, an analog to digital conversion process in which the common voltage Vcom is input as the input signal Vin, and only the most significant digital intermediate value b[1:0] that is output from the sub ADC 14 is fixed to "01" is also performed. Further, in the step S3, in the topology of the formation 3 shown in FIG. 4, an analog to digital conversion process in which the common voltage Vcom is input as the input signal Vin, and only the most significant digital intermediate value b[1:0] that is output from the sub ADC 14 is fixed to "01" is performed.

Note that the analog digital conversion processes of the steps S1 to S3 can be performed when a ratio between the second bit of the digital intermediate value b[1] and the first bit of the digital intermediate value b[0] is 2:1.

Then, in the analog to digital converter 1 according to the first embodiment, the amplification factor P of the residue amplifier 16 and the weight ratio γ of the sub DAC 15 are calculated according to results obtained from the analog to digital conversion processes performed in the steps S1 to S3 (step S4).

The amplification factor P can be derived by obtaining the amplification factor P in which an added value of the results of the analog to digital conversion processes in the steps S1 to S3 where the MSB is "01" will become equal to an added value of the results of the analog to digital conversion processes in the steps S1 to S3 where the MSB is "10". In a process of deriving the amplification factor P, errors of the weight ratio γ and the weight α of the sub DAC 15 from the ideal value can be ignored.

The weight ratio γ can be derived by deriving the amplification factor P, substituting the corrected amplification factor P (the amplification factor P that has been derived as above) in the results of the analog to digital conversion process in the step S1, and then searching for a solution.

Next, in the analog to digital converter 1 according to the first embodiment, in the step S5, in the topology of the formation 1, an analog to digital conversion process in which the common voltage Vcom is input as the input signal Vin is performed.

Then, in the analog to digital converter 1 according to the first embodiment, the weight α is derived according to a result of the step S5 (step S16). More specifically, in the step S6, the weight α in which the result obtained in the step S5 will become as close as possible to a result of converting the common voltage Vcom, which is a known voltage value, is derived. Note that in the analog to digital conversion process in the step S5, as the offset voltage Vos of the amplifier 33 has an influence on a result of the search for the weight α, it is preferable to remove the influence of the offset voltage Vos as much as possible by appropriately applying the chopping technique in the conversion process of the step S5.

An advantage obtained by the above-mentioned calibration process shall be explained using expressions. The transmission characteristic of the analog to digital converter 1 according to the first embodiment is shown in Expression (1).

[Expression 1]

$$Vres = Peff \cdot Vin \pm \alpha 0 eff \cdot Vref \pm \alpha 1 eff \cdot Vref + Peff \cdot Vos \quad (1)$$

In this Expression (1), Vres is a voltage of the residue signal Vres. In Expression (1), Peff is the amplification factor P with a consideration over a finite gain A of the amplifier 33. In Expression (1), α0eff is a weight on a first bit of the sub DAC 15 with a consideration over the finite gain A of the amplifier 33. In Expression (1), α1eff is a weight on a second bit of the sub DAC 15 with a consideration over the finite gain A of the amplifier 33. In Expression (1), Vos is the offset voltage of the amplifier 33. In Expression (1), the high potential reference voltage VrefH is represented by +Vref, while the low potential reference voltage VrefL is represented by −Vref. Further, in Expression (1), Peff, α0eff, and α1eff are represented by Expressions (2) to (4), respectively.

[Expression 2]

$$Peff = \frac{Cf + Cs1 + Cs2 + Cs3}{\left(1 + \frac{1}{A}\right) \cdot Cf + \frac{Cs1 + Cs2 + Cs3}{A}} = \frac{P}{1 + \frac{1 + \alpha 0 + \alpha 1}{A}} = \frac{P}{\eta} \quad (2)$$

[Expression 3]

$$\alpha 0 eff = \frac{Cs1}{\left(1 + \frac{1}{A}\right) \cdot Cf + \frac{Cs1 + Cs2 + Cs3}{A}} = \frac{\alpha 0}{\eta} \quad (3)$$

[Expression 4]

$$\alpha 1 eff = \frac{Cs2 + Cs3}{\left(1 + \frac{1}{A}\right) \cdot Cf + \frac{Cs1 + Cs2 + Cs3}{A}} = \frac{\alpha 1}{\eta} \quad (4)$$

In Expression (2), the amplification factor P, weights α0 and α1, and a coefficient η are represented by Expressions (5) to (8), respectively. Note that Cf is a capacitance value of the feedback capacitor Cf, and Cs1 to Cs3 are capacitance values of the sampling capacitors Cs1 to Cs3, respectively.

[Expression 5]

$$P = \frac{Cf + Cs1 + Cs2 + Cs3}{Cf} \quad (5)$$

[Expression 6]

$$\alpha 0 = \frac{Cs1}{Cf} \quad (6)$$

[Expression 7]

$$\alpha 1 = \frac{Cs2 + Cs3}{Cf} \quad (7)$$

[Expression 8]

$$\eta = 1 + \frac{1 + \alpha 0 + \alpha 1}{A} \quad (8)$$

Then, assuming that a cyclic ADC is used, when Expression (1) is developed to L bits, Expression (9) can be obtained. Note that as the analog to digital converter 1 according to the first embodiment is a cyclic analog to digital converter, an offset voltage Vos' that assumes a cyclic operation is used as the offset voltage Vos.

[Expression 9]

$$\frac{Vin}{Vfs} = \alpha 0 eff \sum_{k=1}^{L} \frac{1}{Peff^k} b[0]_k + \alpha 1 eff \sum_{k=1}^{L} \frac{1}{Peff^k} b[1]_k + \quad (9)$$

$$\frac{1}{Peff^L} \cdot \frac{Vres(L)}{Vfs} + \frac{Vos'}{Vfs}$$

$$Vos' = Vos \sum_{k=1}^{L} \frac{1}{Peff^{k-1}}$$

In the analog to digital converter 1 according to the first embodiment, calculation at the time of the calibration is performed using Expression (10) which is a modified expression of Expression (9).

[Expression 10]

$$\frac{Vin}{Vfs} = \quad (10)$$

$$\alpha 0 eff \left( \sum_{k=1}^{L} \frac{1}{Peff^k} b[0]_k + \gamma \sum_{k=1}^{L} \frac{1}{Peff^k} b[1]_k \right) + \frac{1}{Peff^L} \frac{Vres(L)}{Vfs} + \frac{Vos'}{Vfs}$$

In Expression (10), Vin is a voltage value of the input signal Vin, and Vfs is a width of an input voltage that can be converted by the analog to digital converter 1. Further, in Expression (10), the weight ratio γ is represented by Expression (11).

[Expression 11]

$$\gamma = \frac{\alpha 1 eff}{\alpha 0 eff} \quad (11)$$

In the analog to digital converter 1 according to the first embodiment, two kinds of analog to digital conversion processes, namely, analog to digital conversion processes in which only the MSB of the digital intermediate value b[1:0] is fixed to "01" and "10", are performed. A result of the two analog to digital conversion processes will be the same conversion result because of the redundancy included in the non-binary MDAC. Thus, Expression (9) can be represented by Expression (12). Note that in the conversion from Expression (9) into Expression (12), the following approximation has been used. A term of the residue signal Vres(L) in Expression (10) is a term representing a quantization error. As a quantization error at the time of the calibration will become sufficiently smaller than a quantization error at the time of a normal operation, the term of the residual signal Vres(L) at the time of the calibration shall be ignored. Further, the offset voltage Vos' shall be ignored as the offset voltage Vos' is the same in the conversion process where only the MSB of the digital intermediate value b[1:0] is set to "01" and in the conversion process where only the MSB of the digital intermediate value b[1:0] is set to "10".

[Expression 12]

$$\frac{Vin - Vos'}{Vfs} = \alpha 0 \textit{eff} \sum_{k=1}^{L} \frac{1}{Peff^k} b[0]_{01k} + \alpha 1 \textit{eff} \sum_{k=1}^{L} \frac{1}{Peff^k} b[1]_{01k} \quad (12)$$

$$= \alpha 0 \textit{eff} \sum_{k=1}^{L} \frac{1}{Peff^k} b[0]_{10k} + \alpha 1 \textit{eff} \sum_{k=1}^{L} \frac{1}{Peff^k} b[1]_{10k}$$

Then, the results of the analog to digital conversion processes in the steps S1 to S3 are obtained by Expressions (13) to (15). Note that the digital intermediate value $b[1:0]^{[1]}$ indicates a bit string obtained in the step S1. The digital intermediate value $b[1:0]^{[2]}$ indicates a bit string obtained in the step S2. The digital intermediate value $b[1:0]^{[3]}$ indicates a bit sequence obtained in the step S3. Further, the digital intermediate value $b[1:0]^{[x]}_{01}$ indicates a bit string obtained in the conversion process where the MSB is fixed to "01". The digital intermediate value $b[1:0]^{[x]}_{10}$ indicates a bit string obtained in the conversion process where the MSB is fixed to "10". In this Expression, x indicates the formation number of FIG. 4.

[Expression 13]

$$\frac{Vin - Vos'}{Vfs} = \alpha 01 \textit{eff} \sum_{k=1}^{L} \frac{1}{Peff^k} b[0]^{[1]}_{01k} + \alpha 11 \textit{eff} \sum_{k=1}^{L} \frac{1}{Peff^k} b[1]^{[1]}_{01k} \quad (13)$$

$$\alpha 01 \textit{eff} \sum_{k=1}^{L} \frac{1}{Peff^k} b[0]^{[1]}_{10k} + \alpha 11 \textit{eff} \sum_{k=1}^{L} \frac{1}{Peff^k} b[1]^{[1]}_{10k}$$

[Expression 14]

$$\frac{Vin - Vos}{Vfs} = \alpha 02 \textit{eff} \sum_{k=1}^{L} \frac{1}{Peff^k} b[0]^{[2]}_{01k} + \alpha 12 \textit{eff} \sum_{k=1}^{L} \frac{1}{Peff^k} b[1]^{[2]}_{01k} \quad (14)$$

$$\alpha 02 \textit{eff} \sum_{k=1}^{L} \frac{1}{Peff^k} b[0]^{[2]}_{10k} + \alpha 12 \textit{eff} \sum_{k=1}^{L} \frac{1}{Peff^k} b[1]^{[2]}_{10k}$$

[Expression 15]

$$\frac{Vin - Vos}{Vfs} = \alpha 03 \textit{eff} \sum_{k=1}^{L} \frac{1}{Peff^k} b[0]^{[3]}_{01k} + \alpha 13 \textit{eff} \sum_{k=1}^{L} \frac{1}{Peff^k} b[1]^{[3]}_{01k} \quad (15)$$

$$\alpha 03 \textit{eff} \sum_{k=1}^{L} \frac{1}{Peff^k} b[0]^{[3]}_{10k} + \alpha 13 \textit{eff} \sum_{k=1}^{L} \frac{1}{Peff^k} b[1]^{[3]}_{10k}$$

Moreover, $\alpha 0 x \textit{eff}$ in Expressions (13) to (15) is represented by Expression (16), and $\alpha 1 x \textit{eff}$ in Expressions (13) to (15) is represented by Expression (17).

[Expression 16]

$$\left. \begin{array}{l} \alpha 0 x \textit{eff} = \dfrac{\alpha 0 x}{\eta} \\ \alpha 01 = \dfrac{Cs1}{Cf} \\ \alpha 02 = \dfrac{Cs2}{Cf} \\ \alpha 03 = \dfrac{Cs3}{Cf} \end{array} \right\} \quad (16)$$

[Expression 17]

$$\left. \begin{array}{l} \alpha 1 x \textit{eff} = \dfrac{\alpha 1 x}{\eta} \\ \alpha 11 = \dfrac{Cs2 + Cs3}{Cf} \\ \alpha 12 = \dfrac{Cs1 + Cs3}{Cf} \\ \alpha 13 = \dfrac{Cs1 + Cs2}{Cf} \end{array} \right\} \quad (17)$$

Further, in Expressions (16) and (17), $\eta$ is represented by Expression (18).

[Expression 18]

$$\eta = 1 + \frac{1 + \alpha 01 + \alpha 11}{A} \quad (18)$$

In order to simplify Expressions (13) to (15), Expressions (19) to (22) shall be assumed. The assumption of Expressions (19) to (22) is made by using $b[1:0]^{[1]}_{01} \approx b[1:0]^{[2]}_{01} \approx b[1:0]^{[3]}_{01}$ and $b[1:0]^{[1]}_{10} \approx b[1:0]^{[2]}_{10} \approx b[1:0]^{[3]}_{10}$. Although these relations are not precisely satisfied, it has been confirmed in a simulation that there is no problem if these relations are assumed to be satisfied.

[Expression 19]

$$\sum_{k=1}^{L} b[0]_{01k} \cong \sum_{k=1}^{L} b[0]^{[1]}_{01k} \cong \sum_{k=1}^{L} b[0]^{[2]}_{01k} \cong \sum_{k=1}^{L} b[0]^{[3]}_{01k} \ldots \quad (19)$$

[Expression 20]

$$\sum_{k=1}^{L} b[1]_{01k} \cong \sum_{k=1}^{L} b[1]^{[1]}_{01k} \cong \sum_{k=1}^{L} b[1]^{[2]}_{01k} \cong \sum_{k=1}^{L} b[1]^{[3]}_{01k} \ldots \quad (20)$$

[Expression 21]

$$\sum_{k=1}^{L} b[0]_{10k} \cong \sum_{k=1}^{L} b[0]^{[1]}_{10k} \cong \sum_{k=1}^{L} b[0]^{[2]}_{10k} \cong \sum_{k=1}^{L} b[0]^{[3]}_{10k} \ldots \quad (21)$$

[Expression 22]

$$\sum_{k=1}^{L} b[1]_{10k} \cong \sum_{k=1}^{L} b[1]^{[1]}_{10k} \cong \sum_{k=1}^{L} b[1]^{[2]}_{10k} \cong \sum_{k=1}^{L} b[1]^{[3]}_{10k} \ldots \quad (22)$$

Then, when Expressions (19) to (22) are applied to Expressions (13) to (15), and Expressions (13) to (15) are added, Expression (23) can be obtained.

[Expression 23]

$$\frac{3(Vin - Vos')}{Vfs(\alpha 0 \textit{eff} + \alpha 1 \textit{eff})} = \sum_{k=1}^{L} \frac{1}{Peff^k} b[0]^{[1]}_{01k} + 2 \sum_{k=1}^{L} \frac{1}{Peff^k} b[1]^{[1]}_{01k} \quad (23)$$

$$= \sum_{k=1}^{L} \frac{1}{Peff^k} b[0]^{[1]}_{10k} + 2 \sum_{k=1}^{L} \frac{1}{Peff^k} b[1]^{[1]}_{10k} \ldots$$

In Expression (23), it can be seen from a result obtained when the MSB of b[1:0] is fixed to "01" (left side) and a result obtained when the MSB of b[1:0] is fixed to "10"

(right side) that an indefinite correction term is only the amplification factor Peff. Therefore, by searching for the amplification factor Peff at which the right and left sides of Expression (23) match, the amplification factor P which should be derived by the amplification factor calculation unit 21 can be derived. A binary search or the like can be used for this search.

Note that in steps S1 to S3, as the weight of the digital intermediate value b [0] is one, and the weight of the digital intermediate value b [1] is two, a relation between Expressions (24) and (25) can be derived.

[Expression 24]

$$\alpha 01\text{eff} + \alpha 02\text{eff} + \alpha 03\text{eff} = \alpha 0\text{eff} + \alpha 1\text{eff} \tag{24}$$

[Expression 25]

$$\alpha 11\text{eff} + \alpha 12\text{eff} + \alpha 13\text{eff} = 2(\alpha 0\text{eff} + \alpha 1\text{eff}) \tag{25}$$

Next, in the analog to digital converter 1 according to the first embodiment, the weight ratio γ is derived. When the weights α0eff and α1eff are directly derived, there will be two correction coefficients to be derived, which increases the difficulty of the derivation. Thus, the weight ratio γ is derived in order to simplify the derivation of this term of these weights. When the weight ratio γ is derived, Expression (26), which is an expression obtained by normalizing Expression (23) by α0eff, is used. Further, the weight ratio γ in Expression (26) can be represented by Expression (27).

[Expression 26]

$$\frac{(Vin - Vos')}{Vfs} \frac{1}{\alpha 0\text{eff}} = \sum_{k=1}^{L} \frac{1}{Peff^k} b[0]_{01k} + \gamma \sum_{k=1}^{L} \frac{1}{Peff^k} b[1]_{01k} \tag{26}$$

$$= \sum_{k=1}^{L} \frac{1}{Peff^k} b[0]_{10k} + \gamma \sum_{k=1}^{L} \frac{1}{Peff^k} b[1]_{10k} \ldots$$

[Expression 27]

$$\gamma = \frac{\alpha 1\text{eff}}{\alpha 0\text{eff}} \ldots \tag{27}$$

Referring to Expression (26), it can be seen that the indefinite correction term is only the weight ratio γ by using the amplification factor Peff that has been derived by Expression (23). Then, the weight ratio γ which should be derived by the weight ratio calculation unit 22 can be derived by searching for the weight ratio γ at which the left and right sides of Expression (26) match. The binary search or the like can be used for this search. Note that it is obvious that similar results can be obtained when Expression (23) is standardized by the weight α1eff and when Expression (23) is standardized by α0eff.

Next, calculation of the weight α in the step S6 shall be explained. The calculation in the step S6 is performed according to the result of the analog to digital conversion process in the step S5. In the step S5, in the topology of the formation 1, an analog to digital conversion process in which the common voltage Vcom having the known voltage value is input as the input signal Vin is performed. Further, in the step S5, the chopping technique for removing the influence of the offset voltage Vos' is used. Then, Expression (28) can be obtained by modifying Expression (10). In Expression (28), it can be seen that a term including the offset voltage Vos' is cancelled out by the chopping technique.

[Expression 28]

$$\frac{2Vin}{Vfs} - \frac{2Vcom}{Vfs} = \tag{28}$$

$$\alpha 0\text{eff} \sum_{k=1}^{L} \frac{1}{Peff^k} b[0]_k + \gamma * \alpha 0\text{eff} \sum_{k=1}^{L} \frac{1}{Peff^k} b[1]_k + \frac{Vos}{Vfs} - \frac{Vos'}{Vfs} \ldots$$

In Expression (28), it can be seen that the indefinite correction term is only the weight α0eff, and by solving Expression (28), the weight calculation unit 23 can easily derive the weight α0eff. Further, as α1eff=γ*α0eff, the weight α1eff can be easily derived by applying the weight ratio γ that has been derived by Expression (26).

Moreover, as the amplification factor Peff, the weight ratio γ, and the weight α0eff have been obtained by the calculation so far, the offset voltage Vos' can be derived by performing calculation on the result of the analog to digital conversion process in which the common Voltage Vcom is input as the input signal Vin without using the chopping technique. Expression (29) shows a result of the analog to digital conversion process in which the common voltage Vcom is input as the input signal Vin without using the chopping technique.

[Expression 29]

$$\frac{2Vin}{Vfs} = \tag{29}$$

$$\frac{2Vcom}{Vfs} = \alpha 0\text{eff} \sum_{k=1}^{L} \frac{1}{Peff^k} b[0]_k + \gamma * \alpha 0\text{eff} \sum_{k=1}^{L} \frac{1}{Peff^k} b[1]_k + \frac{Vos}{Vfs} \ldots$$

In the analog to digital converter 1 according to the first embodiment, a first calibration process and a second calibration process are performed. In the first calibration process, calculation of the correction coefficient is performed using the fact that the results of the two analog to digital conversion processes where only the MSB is fixed to "01" and "10" will become the same (Expressions (23) and (26)). In the second calibration process, the common voltage Vcom which will be the known voltage is input to perform the analog to digital conversion process, and calculation of the correction coefficient is performed using the fact that the result of the conversion will become the common voltage Vcom (Expressions (28) and (29)). In the first calibration process, highly accurate calibration is easy, while in the second calibration, highly accurate calibration is difficult. As the correction coefficients of the amplification factor Peff and the weight ratio γ influences linearity of the analog to digital conversion process, the correction coefficients are calculated in the first calibration process. Moreover, as the accuracy requirement of the weight α and the offset voltage Vos' can be relaxed to some extent, the weight α and the offset voltage Vos' are calculated in the second calibration process.

It has been explained above that the analog to digital converter 1 according to the first embodiment includes the corresponding bit switching unit 32 and the plurality of unit elements (e.g. the sampling capacitors Cs1 to Cs3). The corresponding bit switching unit 32 outputs the reference voltages, the number of which corresponds to the weight of the bit for each bit of the digital intermediate value and also switches the voltage of the reference voltage between the first reference voltage and the second reference voltage according to the value of each bit. The plurality of unit elements are provided to correspond to the number of the reference voltages and have the same capacitance. Then, in the analog to digital converter 1 according to the first embodiment, the rotation operation for switching the combinations of the unit elements and the reference voltages supplied to the unit elements is performed. By doing so, in the analog to digital converter 1 according to the first embodiment, as shown in, for example, Expressions (23) and (26), the number of the correction coefficients which should be derived is reduced to one, so that the calculation of the correction coefficient will become easy.

Further, in the analog to digital converter 1 according to the first embodiment, as the derivation of the coefficients can be simplified, it is possible to speed up the derivation of the correction coefficients. Furthermore, in the analog to digital converter 1 according to the first embodiment, as the rotation operation of the unit elements can be realized by a simple circuit, it is possible to prevent the circuit size from increasing.

In addition, in the analog to digital converter 1 according to the first embodiment, the digital intermediate value is output in multi-bit. Then, the analog to digital converter 1 can obtain high-resolution output data in a shorter time than an analog to digital converter operating based on a single-bit digital intermediate value can. In such an analog to digital converter operating based on a multi-bit digital intermediate value, although there will be problems such as an addition of a large-sized circuit for performing calibration and an increase in a calibration time, the analog to digital converter 1 according to the first embodiment can solve these problems.

Second Embodiment

Figure 9:
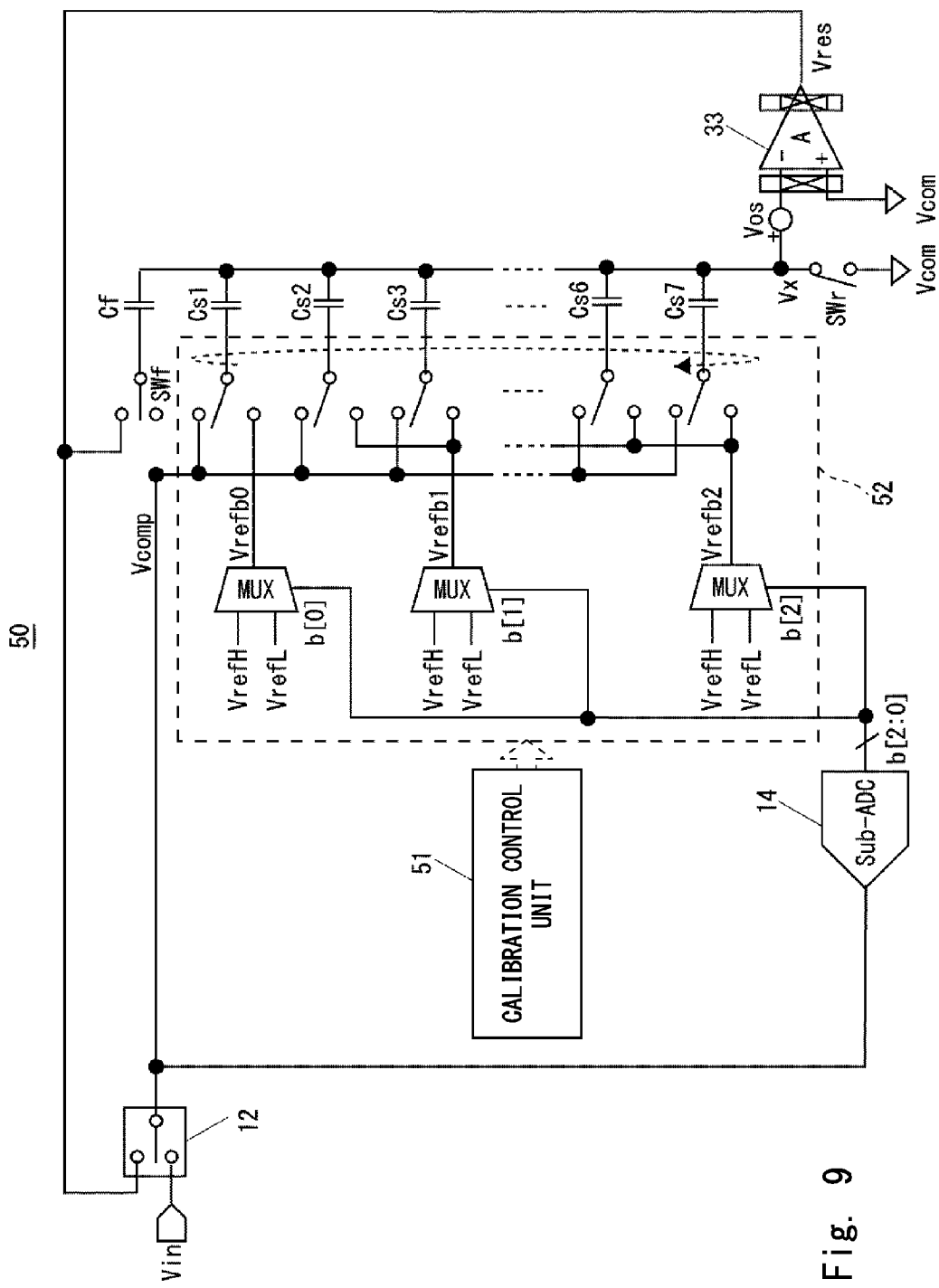
FIG. 9 is a block diagram of an analog unit of an analog to digital converter according to a second embodiment.

In the second embodiment, an analog unit 50 which is a modified example of the analog unit 10 shall be explained. In the analog unit 50, the digital intermediate value output from the sub ADC 14 is expanded to three bits. FIG. 9 is a block diagram of the analog unit 50 according to the second embodiment.

As shown in FIG. 9, in the analog unit 50 according to the second embodiment, the sub ADC 14 outputs a three-bit digital intermediate value b[2:0]. Further, in the analog unit 50, the number of the sampling capacitors which are the unit elements is seven. In a corresponding bit switching unit 52, the kinds of the reference voltages output to correspond to an increase in the number of bits of the digital intermediate value is increased to three. Additionally, a calibration control unit 51 for controlling the rotation operation is provided in the analog unit 50.

Next, the rotation operation in the analog unit 50 according to the second embodiment shall be explained. Also in the analog unit 50 according to the second embodiment, the rotation operation is performed in such a way that the plurality of sampling capacitors Cs1 to Cs7 is combined with all of the reference voltages Vrefb0 to Vrefb2 that are output from the corresponding bit switching unit 52. The rotation operation by the analog unit 50 according to the second embodiment includes two kinds of rotation operations in the normal operation for converting the input signal Vin from analog to digital which are; an operation for rotating the sampling capacitors Cs1 to Cs7 to correspond to all bits of the digital intermediate value: and an operation for rotating only the sampling capacitors Cs1 to Cs3 to correspond to significant two bits of the digital intermediate value.

FIG. 10 is a table for explaining the rotation of the unit elements in an analog to digital converter according to the second embodiment. In the analog unit 50 according to the first embodiment shown in FIG. 9, the digital intermediate value is three bits. Therefore, in the analog unit 50, the weight ratio between the first bit of the digital intermediate value b[0], the second bit of the digital intermediate value b[1], and the third bit of the digital intermediate value b[2] is 1:2:4. Accordingly, the corresponding bit switching unit 52 outputs one reference voltage Vrefb0, in which the voltage of the reference voltage Vrefb0 is switched according to a value of the first bit of the digital intermediate value, two reference voltages Vrefb1, in which the voltage of the reference voltage Vrefb1 is switched according to a value of the second bit of the digital intermediate value, and four reference voltages Vrefb2, in which the voltage of the reference voltage Vrefb2 is switched according to a value of the third bit of the digital intermediate value.

Then, in the analog unit 50 according to the second embodiment, the rotation operation is performed in such a way that seven reference voltages, namely, one reference voltage Vrefb0, two reference voltages Vrefb1, and four reference voltages Vrefb2, are supplied to each of the sampling capacitors Cs1 to Cs7. To be more specific, the analog unit 50 switches topologies of formations 1 to 9 shown in FIG. 10 by the rotation operation.

In the formation 1, the reference voltage Vrefb0 is supplied to the sampling capacitor Cs1, the reference voltage Vrefb1 is supplied to the sampling capacitors Cs2 and Cs3, and the reference voltage Vrefb2 is supplied to the sampling capacitors Cs4 to Cs7. In the formation 2, the reference voltage Vrefb0 is supplied to the sampling capacitor Cs2, the reference voltage Vrefb1 is supplied to the sampling capacitors Cs3 to Cs4, and the reference voltage Vrefb2 is supplied to the sampling capacitors Cs1 and Cs5 to Cs7. In the formation 3, the reference voltage Vrefb0 is supplied to the sampling capacitor Cs3, the reference voltage Vrefb1 is supplied to the sampling capacitors Cs4 and Cs5, and the reference voltage Vrefb2 is supplied to the sampling capacitors Cs1, Cs2, Cs6, and Cs7. In the formation 4, the reference voltage Vrefb0 is supplied to the sampling capacitor Cs4, the reference voltage Vrefb1 is supplied to the sampling capacitors Cs5 and Cs6, and the reference voltage Vrefb2 is supplied to the sampling capacitors Cs1 to Cs3, and Cs7. In the formation 5, the reference voltage Vrefb0 is supplied to the sampling capacitor Cs5, the reference voltage Vrefb1 is supplied to the sampling capacitors Cs6 and Cs7, and the reference voltage Vrefb2 is supplied to the sampling capacitors Cs1 to Cs4. In the formation 6, the reference voltage Vrefb0 is supplied to the sampling capacitor Cs6, the reference voltage Vrefb1 is supplied to the sampling capacitors Cs7 and Cs1, and the reference voltage Vrefb2 is supplied to the sampling capacitors Cs2 to Cs5. In the formation 7, the reference voltage Vrefb0 is supplied to the sampling capacitor Cs7, the reference voltage Vrefb1 is supplied to the sampling capacitors Cs1 and Cs2, and the reference voltage Vrefb2 is supplied to the sampling capacitors Cs3 to Cs6. In the formation 8, the reference voltage Vrefb0 is supplied to the sampling capacitor Cs2, the reference voltage Vrefb1 is supplied to the sampling capacitors Cs1 and Cs3, and the reference voltage Vrefb2 is supplied to the sampling capacitors Cs4 to Cs7. In the formation 9, the reference voltage Vrefb0 is supplied to the sampling capacitor Cs3, the reference voltage Vrefb1 is supplied to the sampling capacitors Cs1 and Cs2, and the reference voltage Vrefb2 is supplied to the sampling capacitors Cs4 to Cs7.

As a method for performing the above-mentioned rotation operation, the analog unit 50 according to the second embodiment can also employ the analog method and the digital method. A circuit configuration for performing the rotation operation shall be explained as follows.

Figure 11:
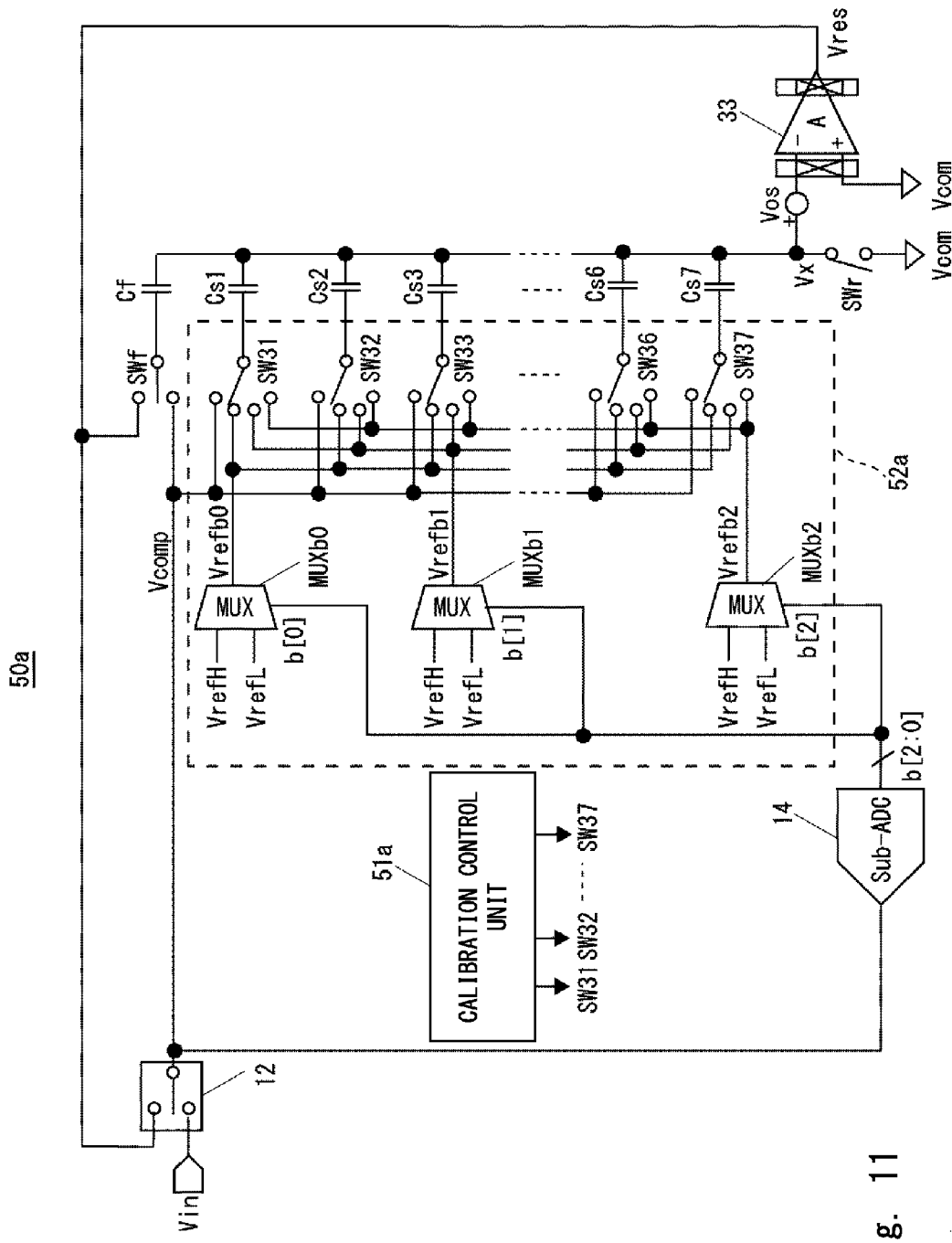
FIG. 11 is a block diagram showing an example of the circuit that realizes the rotation of the unit elements in the analog to digital converter according to the second embodiment.

FIG. 11 is a block diagram of an analog unit 50a that employs the analog method as an example of a circuit that realizes the rotation of the unit elements in the analog to digital converter according to the second embodiment.

As shown in FIG. 11, in the analog unit 50a that employs a rotation circuit of the analog method, a corresponding bit switching unit 52a includes a selector MUXb0 corresponding to the first bit of the digital intermediate value b[0], a selector MUXb1 corresponding to the second bit of the digital intermediate value b[1], and a selector MUXb2 corresponding to the third bit of the digital intermediate value b[2]. Further, switches SW31 to SW37 for switching voltages to be supplied to the sampling capacitors Cs1 to Cs7 are provided in the corresponding bit switching unit 52a. The calibration control unit 51a outputs a switch control signal switching signal for switching connection destinations of the switches SW31 to SW37. Then, the switch SW31 supplies one of the input signal Vcomp and the reference voltages Vrefb0, Vrefb1, and Vrefb2 to the sampling capacitor Cs1. The switch SW32 supplies one of the input signal Vcomp and the reference voltages Vrefb0, Vrefb1, and Vrefb2 to the sampling capacitor Cs2. The switch SW33 supplies one of the input signal Vcomp and the reference voltages Vrefb0, Vrefb1, and Vrefb2 to the sampling capacitor Cs3. The switch SW34 supplies one of the input signal Vcomp and the reference voltages Vrefb0, Vrefb1, and Vrefb2 to the sampling capacitor Cs4. The switch SW35 supplies one of the input signal Vcomp and the reference voltages Vrefb0, Vrefb1, and Vrefb2 to the sampling capacitor Cs5. The switch SW36 supplies one of the input signal Vcomp and the reference voltages Vrefb0, Vrefb1, and Vrefb2 to the sampling capacitor Cs6. The switch SW37 supplies one of the input signal Vcomp and the reference voltages Vrefb0, Vrefb1, and Vrefb2 to the sampling capacitor Cs7.

That is, when the rotation operation is performed using the circuit of the analog method, the corresponding bit switching unit 32a includes a plurality of selection circuits (e.g. the selectors MUXb0 to MUXb2) and a plurality of switch circuits (e.g. the switch circuits SW31 to SW37). The number of the plurality of selection circuits provided is the same as that of the bits of the digital intermediate value. Each of the plurality of selection circuits selects the first reference voltage (e.g. the high potential reference voltage VrefH) and the second reference voltage (e.g. the low potential reference voltage VrefL) according to one of the bits of the digital intermediate value and outputs the selected voltages as the reference voltage. Further, the number of the switch circuits provided is the same as that of the unit elements. Each of the plurality of switch circuits selects one reference voltages output from the selectors MUXb0 to MUXb2. When the rotation operation is performed using the circuit of the analog method, the calibration control unit 51a outputs a switch control signal that controls each of the switch circuits SW31 to SW37 to select all the reference voltages output from the selector MUXb0 to MUXb2 at least once.

Figure 12:
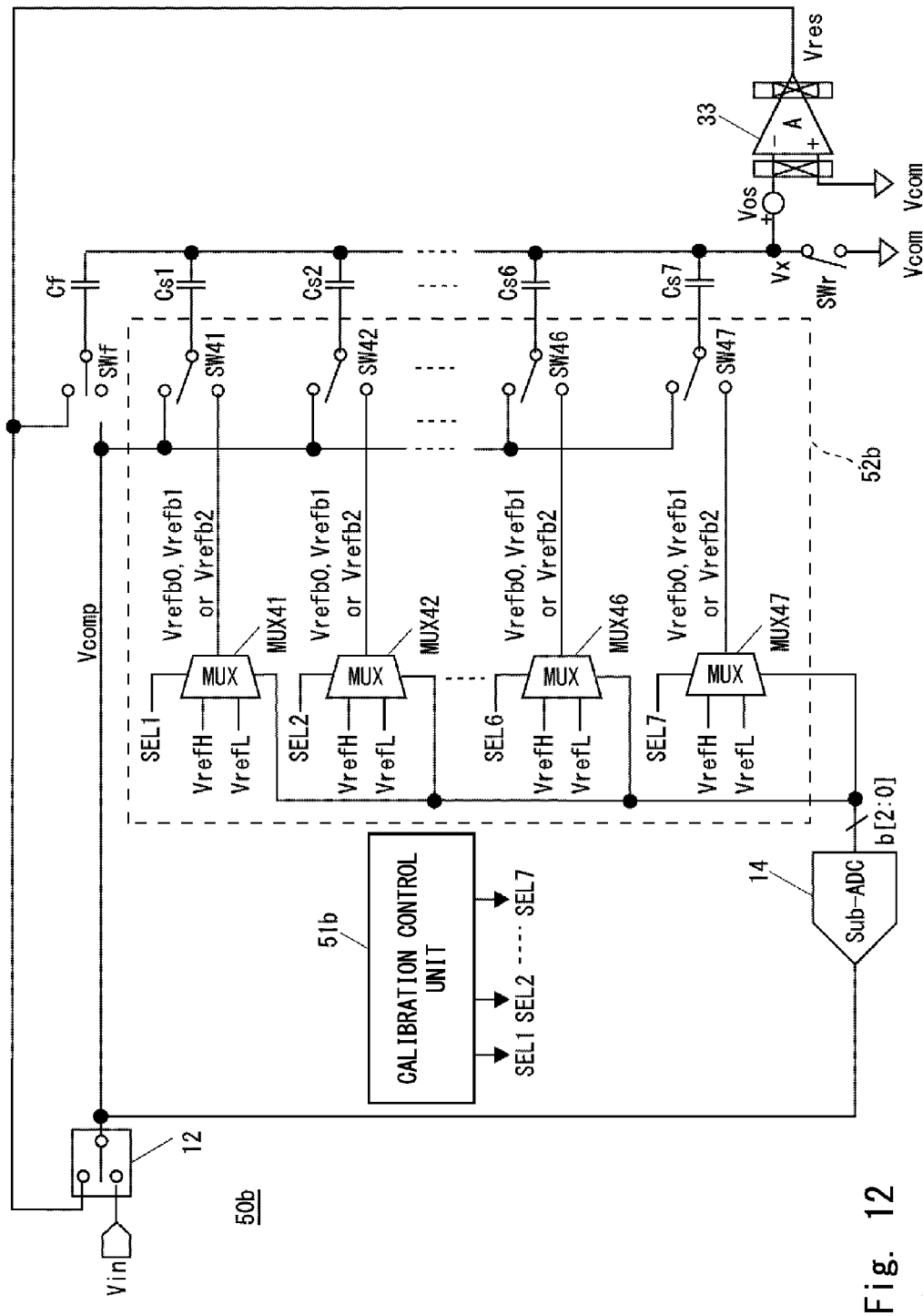
FIG. 12 is a block diagram showing another example of the circuit that realizes the rotation of the unit elements in the analog to digital converter according to the second embodiment.

Next, FIG. 12 is a block diagram showing an analog unit 50b that employs the digital method as an example of the circuit that realizes the rotation of the unit elements in the analog to digital converter according to the second embodiment.

In the analog unit 50b that employs the rotation circuit of the digital method, the corresponding bit switching unit 52b includes selectors MUX41 to MUX47 corresponding to the sampling capacitors Cs1 to Cs7, respectively. Further, switches SW41 to SW47 are provided between the sampling capacitors Cs1 to Cs7 and the selectors MUX41 to MUX47, respectively. Selection signal switching signals SEL1 to SEL7 are supplied to the selectors MUX41 to MUX47, respectively. Then, the selectors MUX41 to MUX47 switch the bits of the digital intermediate value for selecting a voltage of the reference voltage according to the input selection signal switching signal. For example, the selector MUX41 switches, according to the selection signal switching signal SEL1, as to whether to select the voltage of the reference voltage Vrefb0 that is output according to the first bit of the digital intermediate value b[0], to select the voltage of the reference voltage Vrefb1 according to the second bit of the digital intermediate value b[1], or to select the voltage of the reference voltage Vrefb2 according to the third bit of the digital intermediate value b[2]. Further, the switches SW41 to SW47 transmit one of the input signal Vcomp and the reference voltage to the sampling capacitors Cs1 to Cs7 by an analog to digital conversion control circuit not shown.

That is, when the rotation operation is performed by the circuit of the digital method, the corresponding bit switching unit 52b includes the selectors MUX41 to MUX47 for selecting the first reference voltage (e.g. the high potential reference voltage VrefH) and the second reference voltage (e.g. the low potential reference voltage VrefL) according to one of the bits of the digital intermediate value and outputting the selected voltages as the reference voltage. Note that the number of the selectors MUX41 to MUX47 is the same as that of the unit elements. Moreover, the calibration control unit 52b supplies the selectors MUX41 to MUX47 with the selection signal switching signals SEL1 to SEL7 for instructing the selectors MUX41 to MUX47, respectively, to select the reference voltages according to all bit values from the first bit to the last bit of the digital intermediate value.

Next, an operation of the analog to digital converter according to the second embodiment shall be explained. Firstly, in the analog unit 50 of the analog to digital converter according to the second embodiment, the same capacitance value is set to the unit elements (e.g. the sampling capacitors Cs1 to Cs7) inside the sub DAC 15. However, there are variations in the sampling capacitors Cs1 to Cs7, and the capacitance values will be deviated from an ideal value (the same capacitance). On the other hand, in the analog unit 50, in order to make the amplification factor P of the residue amplifier 16 become 4<P<8, the feedback capacitor Cf is set to have a capacitance value that is greater than the values of the sampling capacitors Cs1 to Cs7. When the amplification factor A of the amplifier 33 is $\infty$, the amplification factor P of the residue amplifier 16 is represented by P=(Cf+Cs1+Cs2+Cs3+Cs4+Cs5+Cs6+Cs7)/Cf. The reason for having such an amplification factor is the same as that in the analog to digital converter 1 according to the first embodiment.

Figure 13:
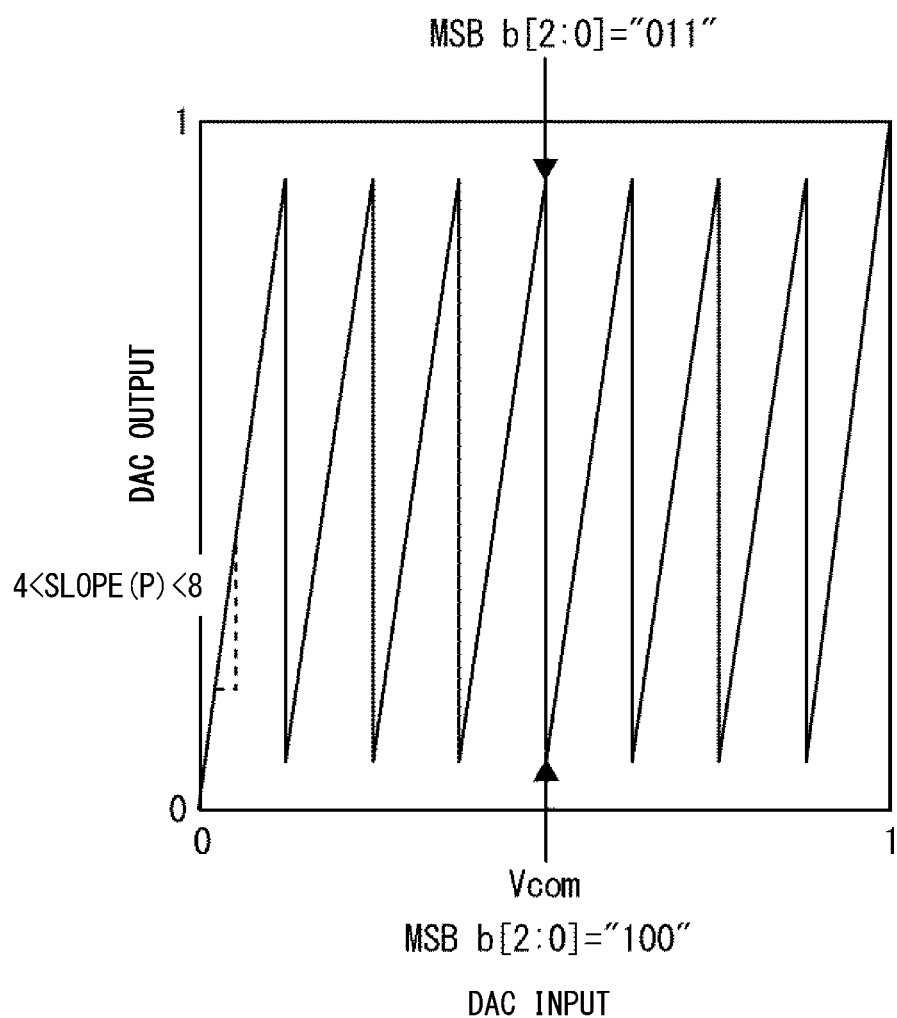
FIG. 13 is a graph for explaining a transmission characteristic of a sub DAC according to the second embodiment.

FIG. 13 shows a transmission characteristic of the analog to digital converter according to the second embodiment. As shown in FIG. 13, in the analog to digital converter according to the second embodiment, a slope of the residue signal Vres with respect to the input signal Vin will become the amplification factor P (e.g. 4<P<8). Further, the common voltage Vcom input at the time of the calibration includes a voltage value in which b[2:0] of the most significant digital intermediate value corresponding to an MSB (Most Significant Bit) of the output data Dout is "011" or "100".

Figure 14:
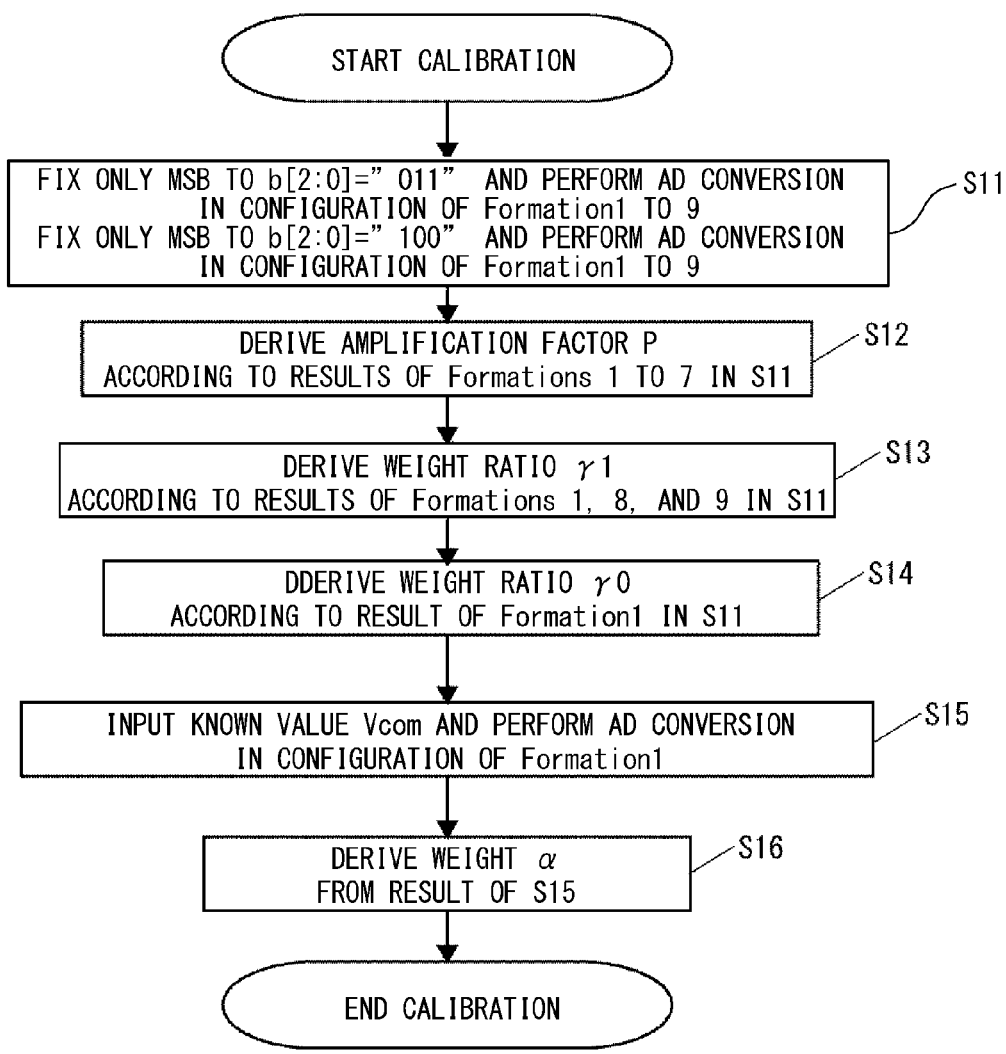
FIG. 14 is a flowchart of a calibration method of the analog to digital converter according to the second embodiment.

Next, a procedure of the calibration operation in the analog to digital converter according to the second embodiment shall be explained. FIG. 14 is a flowchart of a calibration method of the analog to digital converter according to the second embodiment.

As shown in FIG. 14, in the analog to digital converter 1 according to the second embodiment, in the step S11, in the topologies of the formations 1 to 9 shown in FIG. 12, an analog to digital conversion process in which the common voltage Vcom is input as the input signal Vin, and only the most significant digital intermediate value b[2:0] that is output from the sub ADC 14 is fixed to "011" is performed. Further, in the step S11, in the topologies of the formations 1 to 9 shown in FIG. 12, an analog to digital conversion process in which the common voltage Vcom is input as the input signal Vin, and only the most significant digital intermediate value b[2:0] that is output from the sub ADC 14 is fixed to "100" is also performed.

Note that the analog to digital conversion process of the step S11 is performed by setting a ratio between the third bit of the digital intermediate value b[2], the second bit of the digital intermediate value b[1], and the first bit of the digital intermediate value b[0] to 4:2:1.

Next, in the step S12, in the analog to digital conversion circuit according to the second embodiment, the amplification factor P is derived according to results of the analog to digital conversions obtained in the topologies of the formations 1 to 7 shown in FIG. 12.

The amplification factor P can be derived by calculating the amplification factor P in which an added value of the results of the analog to digital conversion processes in the formations 1 to 7 where the MSB is "011" will become equal to an added value of the results of the analog to digital conversion processes where the MSB is "100". In a process of deriving the amplification factor P, errors of the weight ratio γ and the weight α of the sub DAC 15 from the ideal value can be ignored.

Then, in the step S13, the analog to digital converter according to the second embodiment derives a weight ratio γ1 between a combined capacitance of the sampling capacitors Cs1 and Cs2 of the sub DAC 15 and the sampling capacitor Cs3 according to the results obtained from the analog to digital conversion processes performed in the formations 1, 8, and 9 in the step S11.

The weight ratio γ1 can be derived by deriving the amplification factor P, substituting the corrected amplification factor P (the amplification factor P that has been derived as above) in the results of the analog to digital conversion processes obtained in the formations 1, 8, and 9 in the step S11, and then searching for a solution.

Next, in the analog to digital converter according to the second embodiment, in the step S14, a weight ratio γ0 of the sampling capacitors Cs1 and Cs2 of the sub DAC 15 is derived according to the results of the analog to digital conversion processes obtained in the topologies of the formations 1 to 9 in the step S11.

The weight ratio γ0 can be derived by deriving the amplification factor P and the weight ratio γ1, substituting the corrected amplification factor P (the amplification factor P that has been derived as above) and the weight ratio γ1 in the results of the analog to digital conversion processes obtained in the formations 1 to 9 in the step S11, and then searching for a solution.

Next, in the analog to digital converter according to the second embodiment, in the step S15, in the topology of the formation 1, an analog to digital conversion process in which the common voltage Vcom is input as the input signal Vin is performed.

Then, in the analog to digital converter according to the second embodiment, the weight α is derived according to a result of the step S15 (step S16). More specifically, in the step S16, the weight α in which the result obtained in the step S15 will become as close as possible to a result of converting the common voltage Vcom, which is a known voltage value, is derived. Note that in the analog to digital conversion process in the step S15, as the offset voltage Vos' of the amplifier 33 has an influence on a result of the search for the weight α, it is preferable to remove the influence of the offset voltage Vos' as much as possible by appropriately applying the chopping technique in the conversion process in the step S5.

An advantage obtained by the above-mentioned calibration process shall be explained using expressions. The transmission characteristic of the analog to digital converter according to the second embodiment is shown in Expression (30).

[Expression 30]

$$Vres = Peff*Vin \pm \alpha0eff*Vref \pm \alpha1eff*Vref \pm \alpha2eff*Vref + Peff + Vos \quad (30)$$

Expression (30) is a modification of Expression (1) in order to correspond to the three-bit MDAC. In Expression (30), α2eff is a weight on a third bit of the sub DAC 15 with a consideration over the finite gain A of the amplifier 33. Further, Peff, α0eff, α1eff, and α2eff in Expression (30) are represented by Expressions (31) to (34), respectively.

[Expression 31]

$$Peff = \frac{Cf + Cs1 + Cs2 + Cs3 + Cs4 + Cs5 + Cs6 + Cs7}{\left(1 + \frac{1}{A}\right)*Cf + \frac{Cs1 + Cs2 + Cs3 + Cs4 + Cs5 + Cs6 + Cs7}{A}} = \frac{P}{1 + \frac{1 + \alpha0 + \alpha1 + \alpha2}{A}} = \frac{P}{\eta} \ldots \quad (31)$$

[Expression 32]

$$\alpha0eff = \frac{Cs1}{\left(1 + \frac{1}{A}\right)*Cf + \frac{Cs1 + Cs2 + Cs3 + Cs4 + Cs5 + Cs6 + Cs7}{A}} = \frac{\alpha0}{\eta} \ldots \quad (32)$$

[Expression 33]

$$\alpha1eff = \frac{Cs2 + Cs3}{\left(1 + \frac{1}{A}\right)*Cf + \frac{Cs1 + Cs2 + Cs3 + Cs4 + Cs5 + Cs6 + Cs7}{A}} = \frac{\alpha1}{\eta} \ldots \quad (33)$$

-continued

[Expression 34]

$$\alpha2\mathit{eff} = \cfrac{\cfrac{Cs4+Cs5+Cs6+Cs7}{\left(1+\cfrac{1}{A}\right)*Cf+\cfrac{Cs1+Cs2+Cs3+Cs4+Cs5+Cs6+Cs7}{A}}}{} = \cfrac{\alpha2}{\eta} \quad (34)$$

The amplification factor P, weights α0, α1, α2, and a coefficient η in Expression (31) are represented by Expressions (35) to (39), respectively.

[Expression 35]

$$P = \frac{Cf+Cs1+Cs2+Cs3+Cs4+Cs5+Cs6+Cs7}{Cf} \quad \ldots \quad (35)$$

[Expression 36]

$$\alpha0 = \frac{Cs1}{Cf} \quad \ldots \quad (36)$$

[Expression 37]

$$\alpha1 = \frac{Cs2+Cs3}{Cf} \quad \ldots \quad (37)$$

[Expression 38]

$$\alpha2 = \frac{Cs4+Cs5+Cs6+Cs7}{Cf} \quad \ldots \quad (38)$$

[Expression 39]

$$\eta = 1 + \frac{1+\alpha0+\alpha1+\alpha2}{A} \quad \ldots \quad (39)$$

Then, assuming that a cyclic ADC is used, when Expression (30) is developed to L bits, Expression (40) can be obtained.

[Expression 40]

$$\frac{V\mathit{in}}{V\mathit{fs}} = \alpha0\mathit{eff}\sum_{k=1}^{L}\frac{1}{P\mathit{eff}^k}b[0]_k + \alpha1\mathit{eff}\sum_{k=1}^{L}\frac{1}{P\mathit{eff}^k}b[1]_k + \quad (40)$$

$$\alpha2\mathit{eff}\sum_{k=1}^{L}\frac{1}{P\mathit{eff}^k}b[2]_k + \frac{1}{P\mathit{eff}^L}\frac{V\mathit{res}(L)}{V\mathit{fs}} + \frac{V\mathit{os}'}{V\mathit{fs}} \quad \ldots$$

In the analog to digital converter according to the second embodiment, two kinds of analog to digital conversion processes in which only the MSB of the digital intermediate value b[1:0] is fixed to "011" and "100" are performed. A result of the two analog to digital conversion processes will be the same conversion result because of the redundancy included in the non-binary MDAC. Thus, Expression (40) can be represented by Expression (41). Note that in the conversion from Expression (40) into Expression (41), the following approximation has been used. A term of the residue signal Vres(L) in Expression (40) is a term representing a quantization error. As a quantization error at the time of the calibration will become sufficiently smaller than a quantization error at the time of a normal operation, the term of the residual signal Vres(L) at the time of the calibration shall be ignored. Further, the offset voltage Vos' shall be ignored as the offset voltage Vos' is the same in the conversion process where only the MSB of the digital intermediate value b[2:0] is set to "011" and in the conversion process where only the MSB of the digital intermediate value b[2:0] is set to "100".

[Expression 41]

$$\frac{V\mathit{in}-V\mathit{os}'}{V\mathit{fs}} = \alpha0\mathit{eff}\sum_{k=1}^{L}\frac{1}{P\mathit{eff}^k}b[0]_{011k} + \alpha1\mathit{eff}\sum_{k=1}^{L}\frac{1}{P\mathit{eff}^k}b[1]_{011k} + \quad (41)$$

$$\alpha2\mathit{eff}\sum_{k=1}^{L}\frac{1}{P\mathit{eff}^k}b[2]_{011k}$$

$$= \alpha0\mathit{eff}\sum_{k=1}^{L}\frac{1}{P\mathit{eff}^k}b[0]_{100k} + \alpha1\mathit{eff}\sum_{k=1}^{L}\frac{1}{P\mathit{eff}^k}b[1]_{100k} +$$

$$\alpha2\mathit{eff}\sum_{k=1}^{L}\frac{1}{P\mathit{eff}^k}b[2]_{100k}$$

Then, the results of the analog to digital conversion processes in the step S11 are obtained by Expressions (42) to (50). Note that the digital intermediate value b[2:0]$^{[1\ to\ 9]}$ indicates a bit string obtained in the formations 1 to 9. The digital intermediate value b[2:0]$^{[x]}_{011}$ indicates a bit string obtained in the conversion process where the MSB is fixed to "011". The digital intermediate value b[2:0]$^{[x]}_{100}$ indicates a bit string obtained in the conversion process where the MSB is fixed to "100". In this Expression, x indicates the formation number of FIG. 10.

[Expression 42]

$$\alpha0\mathit{eff}\sum_{k=1}^{L}\frac{1}{P\mathit{eff}^k}b[0]^{[1]}_{011k} + \alpha1\mathit{eff}\sum_{k=1}^{L}\frac{1}{P\mathit{eff}^k}b[1]^{[1]}_{011k} + \quad (42)$$

$$\alpha2\mathit{eff}\sum_{k=1}^{L}\frac{1}{P\mathit{eff}^k}b[2]^{[1]}_{011k} = \alpha0\mathit{eff}\sum_{k=1}^{L}\frac{1}{P\mathit{eff}^k}b[0]^{[1]}_{100k} +$$

$$\alpha1\mathit{eff}\sum_{k=1}^{L}\frac{1}{P\mathit{eff}^k}b[1]^{[1]}_{100k} + \alpha2\mathit{eff}\sum_{k=1}^{L}\frac{1}{P\mathit{eff}^k}b[2]^{[1]}_{100k} \ldots$$

[Expression 43]

$$\alpha0\mathit{eff}\sum_{k=1}^{L}\frac{1}{P\mathit{eff}^k}b[0]^{[2]}_{011k} + \alpha1\mathit{eff}\sum_{k=1}^{L}\frac{1}{P\mathit{eff}^k}b[1]^{[2]}_{011k} + \quad (43)$$

$$\alpha2\mathit{eff}\sum_{k=1}^{L}\frac{1}{P\mathit{eff}^k}b[2]^{[2]}_{011k} = \alpha0\mathit{eff}\sum_{k=1}^{L}\frac{1}{P\mathit{eff}^k}b[0]^{[2]}_{100k} +$$

$$\alpha1\mathit{eff}\sum_{k=1}^{L}\frac{1}{P\mathit{eff}^k}b[1]^{[2]}_{100k} + \alpha2\mathit{eff}\sum_{k=1}^{L}\frac{1}{P\mathit{eff}^k}b[2]^{[2]}_{100k} \ldots$$

[Expression 44]

$$\alpha 0 eff \sum_{k=1}^{L} \frac{1}{Peff^k} b[0]_{011k}^{[3]} + \alpha 1 eff \sum_{k=1}^{L} \frac{1}{Peff^k} b[1]_{011k}^{[3]} + \alpha 2 eff \sum_{k=1}^{L} \frac{1}{Peff^k} b[2]_{011k}^{[3]} = \alpha 0 eff \sum_{k=1}^{L} \frac{1}{Peff^k} b[0]_{100k}^{[3]} + \alpha 1 eff \sum_{k=1}^{L} \frac{1}{Peff^k} b[1]_{100k}^{[3]} + \alpha 2 eff \sum_{k=1}^{L} \frac{1}{Peff^k} b[2]_{100k}^{[3]} \dots \quad (44)$$

[Expression 45]

$$\alpha 0 eff \sum_{k=1}^{L} \frac{1}{Peff^k} b[0]_{011k}^{[4]} + \alpha 1 eff \sum_{k=1}^{L} \frac{1}{Peff^k} b[1]_{011k}^{[4]} + \alpha 2 eff \sum_{k=1}^{L} \frac{1}{Peff^k} b[2]_{011k}^{[4]} = \alpha 0 eff \sum_{k=1}^{L} \frac{1}{Peff^k} b[0]_{100k}^{[4]} + \alpha 1 eff \sum_{k=1}^{L} \frac{1}{Peff^k} b[1]_{100k}^{[4]} + \alpha 2 eff \sum_{k=1}^{L} \frac{1}{Peff^k} b[2]_{100k}^{[4]} \dots \quad (45)$$

[Expression 46]

$$\alpha 0 eff \sum_{k=1}^{L} \frac{1}{Peff^k} b[0]_{011k}^{[5]} + \alpha 1 eff \sum_{k=1}^{L} \frac{1}{Peff^k} b[1]_{011k}^{[5]} + \alpha 2 eff \sum_{k=1}^{L} \frac{1}{Peff^k} b[2]_{011k}^{[5]} = \alpha 0 eff \sum_{k=1}^{L} \frac{1}{Peff^k} b[0]_{100k}^{[5]} + \alpha 1 eff \sum_{k=1}^{L} \frac{1}{Peff^k} b[1]_{100k}^{[5]} + \alpha 2 eff \sum_{k=1}^{L} \frac{1}{Peff^k} b[2]_{100k}^{[5]} \dots \quad (46)$$

[Expression 47]

$$\alpha 0 eff \sum_{k=1}^{L} \frac{1}{Peff^k} b[0]_{011k}^{[6]} + \alpha 1 eff \sum_{k=1}^{L} \frac{1}{Peff^k} b[1]_{011k}^{[6]} + \alpha 2 eff \sum_{k=1}^{L} \frac{1}{Peff^k} b[2]_{011k}^{[6]} = \alpha 0 eff \sum_{k=1}^{L} \frac{1}{Peff^k} b[0]_{100k}^{[6]} + \alpha 1 eff \sum_{k=1}^{L} \frac{1}{Peff^k} b[1]_{100k}^{[6]} + \alpha 2 eff \sum_{k=1}^{L} \frac{1}{Peff^k} b[2]_{100k}^{[6]} \dots \quad (47)$$

[Expression 48]

$$\alpha 0 eff \sum_{k=1}^{L} \frac{1}{Peff^k} b[0]_{011k}^{[7]} + \alpha 1 eff \sum_{k=1}^{L} \frac{1}{Peff^k} b[1]_{011k}^{[7]} + \alpha 2 eff \sum_{k=1}^{L} \frac{1}{Peff^k} b[2]_{011k}^{[7]} = \alpha 0 eff \sum_{k=1}^{L} \frac{1}{Peff^k} b[0]_{100k}^{[7]} + \alpha 1 eff \sum_{k=1}^{L} \frac{1}{Peff^k} b[1]_{100k}^{[7]} + \alpha 2 eff \sum_{k=1}^{L} \frac{1}{Peff^k} b[2]_{100k}^{[7]} \dots \quad (48)$$

[Expression 49]

$$\alpha 0 eff \sum_{k=1}^{L} \frac{1}{Peff^k} b[0]_{011k}^{[8]} + \alpha 1 eff \sum_{k=1}^{L} \frac{1}{Peff^k} b[1]_{011k}^{[8]} + \alpha 2 eff \sum_{k=1}^{L} \frac{1}{Peff^k} b[2]_{011k}^{[8]} = \alpha 0 eff \sum_{k=1}^{L} \frac{1}{Peff^k} b[0]_{100k}^{[8]} + \alpha 1 eff \sum_{k=1}^{L} \frac{1}{Peff^k} b[1]_{100k}^{[8]} + \alpha 2 eff \sum_{k=1}^{L} \frac{1}{Peff^k} b[2]_{100k}^{[8]} \dots \quad (49)$$

[Expression 50]

$$\alpha 0 eff \sum_{k=1}^{L} \frac{1}{Peff^k} b[0]_{011k}^{[9]} + \alpha 1 eff \sum_{k=1}^{L} \frac{1}{Peff^k} b[1]_{011k}^{[9]} + \alpha 2 eff \sum_{k=1}^{L} \frac{1}{Peff^k} b[2]_{011k}^{[9]} = \alpha 0 eff \sum_{k=1}^{L} \frac{1}{Peff^k} b[0]_{100k}^{[9]} + \alpha 1 eff \sum_{k=1}^{L} \frac{1}{Peff^k} b[1]_{100k}^{[9]} + \alpha 2 eff \sum_{k=1}^{L} \frac{1}{Peff^k} b[2]_{100k}^{[9]} \dots \quad (50)$$

Further, in Expressions (42) to (50), α0xeff is represented by Expression (51), α1xeff is represented by Expression (52), and α2xeff is represented by Expression (53). Note that in Expressions (51) to (53), η is the same as that in Expression (39).

[Expression 51]

$$\left. \begin{aligned} \alpha 0 xeff &= \frac{\alpha 0 x}{\eta} \\ \alpha 01 &= \frac{Cs1}{Cf} \\ \alpha 02 &= \frac{Cs2}{Cf} \\ \alpha 03 &= \frac{Cs3}{Cf} \\ \alpha 04 &= \frac{Cs4}{Cf} \\ \alpha 05 &= \frac{Cs5}{Cf} \\ \alpha 06 &= \frac{Cs6}{Cf} \\ \alpha 07 &= \frac{Cs7}{Cf} \\ \alpha 08 &= \frac{Cs2}{Cf} \\ \alpha 09 &= \frac{Cs3}{Cf} \end{aligned} \right\} \dots \quad (51)$$

[Expression 52]

$$\left. \begin{aligned} \alpha 1 xeff &= \frac{\alpha 1 x}{\eta} \\ \alpha 11 &= \frac{Cs2 + Cs3}{Cf} \\ \alpha 12 &= \frac{Cs3 + Cs4}{Cf} \\ \alpha 13 &= \frac{Cs4 + Cs5}{Cf} \\ \alpha 14 &= \frac{Cs5 + Cs6}{Cf} \\ \dots \\ \alpha 15 &= \frac{Cs6 + Cs7}{Cf} \\ \alpha 16 &= \frac{Cs7 + Cs1}{Cf} \\ \alpha 17 &= \frac{Cs1 + Cs2}{Cf} \\ \alpha 18 &= \frac{Cs3 + Cs1}{Cf} \\ \alpha 19 &= \frac{Cs1 + Cs2}{Cf} \end{aligned} \right\} \dots \quad (52)$$

[Expression 53]

$$\begin{aligned}
\alpha 2xeff &= \frac{\alpha 2x}{\eta} \\
\alpha 21 &= \frac{Cs4 + Cs5 + Cs6 + Cs7}{Cf} \\
\alpha 22 &= \frac{Cs5 + Cs6 + Cs7 + Cs1}{Cf} \\
\alpha 23 &= \frac{Cs6 + Cs7 + Cs1 + Cs2}{Cf} \\
\alpha 24 &= \frac{Cs7 + Cs1 + Cs2 + Cs3}{Cf} \\
\alpha 25 &= \frac{Cs1 + Cs2 + Cs3 + Cs4}{Cf} \\
\alpha 26 &= \frac{Cs2 + Cs3 + Cs4 + Cs5}{Cf} \\
\alpha 27 &= \frac{Cs3 + Cs4 + Cs5 + Cs6}{Cf} \\
\alpha 28 &= \frac{Cs4 + Cs5 + Cs6 + Cs7}{Cf} \\
\alpha 29 &= \frac{Cs4 + Cs5 + Cs6 + Cs7}{Cf}
\end{aligned} \tag{53}$$

Then, a result of adding Expressions (42) to (48) can be obtained by Expression (54). Note that in this addition, Expression is simplified based on an assumption that $b[2:0]^{[1]}_{011}$ to $b[2:0]^{[9]}_{011}$ have substantially the same value and an assumption that $b[2:0]^{[1]}_{10}$ to $b[2:0]^{[9]}_{100}$ have substantially the same value.

[Expression 54]

$$\frac{7(Vin - Vos')}{Vfs(\alpha 0eff + \alpha 1eff + \alpha 2eff)} = \sum_{k=1}^{L} \frac{1}{Peff^k} b[0]_{011k} + 2\sum_{k=1}^{L} \frac{1}{Peff^k} b[1]_{011k} + 4\sum_{k=1}^{L} \frac{1}{Peff^k} * b[2]_{011k}$$

$$= \sum_{k=1}^{L} \frac{1}{Peff^k} b[0]_{100k} + 2\sum_{k=1}^{L} \frac{1}{Peff^k} * b[1]_{100k} + 4\sum_{k=1}^{L} \frac{1}{Peff^k} b[2]_{100k} \ldots \tag{54}$$

In Expression (54), it can be seen from a result obtained when the MSB of b[2:0] is fixed to "011" (left side) and a result obtained when the MSB of b[2:0] is fixed to "100" (right side) that an indefinite correction term is only the amplification factor Peff. Therefore, by searching for the amplification factor Peff at which the right and left sides of Expression (54) match, the amplification factor P which should be derived by the amplification factor calculation unit 21 can be derived. A binary search or the like can be used for this search.

Note that in the step S11, as the weight of the digital intermediate value b[0] is one, the weight of the digital intermediate value b[1] is two, and the weight of the digital intermediate value b[2] is four, a relation between Expressions (55) and (58) can be derived.

[Expression 55]

$$\alpha 01eff + \alpha 02eff + \alpha 03eff + \alpha 04eff + \alpha 05eff + \alpha 06eff + \alpha 07eff = \alpha 0eff + \alpha 1eff + \alpha eff \tag{55}$$

[Expression 56]

$$\alpha 11eff + \alpha 12eff + \alpha 13eff + \alpha 14eff + \alpha 15eff + \alpha 16eff + \alpha 17eff = 2(\alpha 0eff + \alpha 1eff + \alpha 2eff) \tag{56}$$

[Expression 57]

$$\alpha 21eff + \alpha 22eff + \alpha 23eff + \alpha 24eff + \alpha 25eff + \alpha 26eff + \alpha 27eff = 4(\alpha 0eff + \alpha 1eff + \alpha 2eff) \tag{57}$$

Next, in the analog to digital converter according to the second embodiment, the weight ratio γ1 is derived. When the weights ϵ0eff, α1eff, and α2eff are directly derived, there will be three correction coefficients to be derived, which increases the difficulty of the derivation. Thus, the weight ratio γ1 is derived in order to simplify the derivation of this term of these weights. When the weight ratio γ1 is derived, Expression (58) that is obtained by adding Expressions (42), (49), and (50) is used. Further, the weight ratio γ1 in Expression (58) is represented by Expression (59).

[Expression 58]

$$\frac{3(Vin - Vos')}{Vfs(\alpha 0eff + \alpha 1eff)} = \sum_{k=1}^{L} \frac{1}{Peff^k} b[0]_{011k} + 2\sum_{k=1}^{L} \frac{1}{Peff^k} * b[1]_{011k} +$$

$$3 * \gamma 1 \sum_{k=1}^{L} \frac{1}{Peff^k} * b[2]_{011k}$$

$$= \sum_{k=1}^{L} \frac{1}{Peff^k} * b[0]_{100k} + 2\sum_{k=1}^{L} \frac{1}{Peff^k} * b[1]_{100k} +$$

$$3 * \gamma 1 \sum_{k=1}^{L} \frac{1}{Peff^k} * b[2]_{100k} \ldots \tag{58}$$

[Expression 59]

$$\gamma 1 = \frac{\alpha 2eff}{\alpha 0eff + \alpha 1eff} \ldots \tag{59}$$

Referring to Expression (58), it can be seen that the indefinite correction term is only the weight ratio γ1 by using the amplification factor Peff that has been derived by Expression (54). Then, the weight ratio γ1 which should be derived by the weight ratio calculation unit 22 can be derived by searching for the weight ratio γ1 at which the left and right sides of Expression (58) match. A binary search or the like can be used for this search.

Next, in the analog to digital converter according to the second embodiment, the weight ratio γ0 is derived from the result of the analog to digital conversion process in the formation 1. When the weights α0eff, α1eff, and α2eff are directly derived, there will be three correction coefficients to be derived, which increases the difficulty of the derivation. Thus, the weight ratio γ0 is derived in order to simplify the derivation of this term of these weights. When the weight ratio γ0 is derived, Expression (42) that is obtained by the analog to digital conversion process in the formation 1 is used. Note that when the weight ratio γ0 is derived, Expression (60) that is a modification of Expression (42) is used. The weight ratios γ0 and γ1 in Expression (60) are represented by Expressions (61) and (62), respectively.

[Expression 60]

$$\frac{Vin - Vos'}{Vfs * \alpha 0 eff} = \sum_{k=1}^{L} \frac{1}{Peff^k} b[0]_{011k} + \gamma 0 \sum_{k=1}^{L} \frac{1}{Peff^k} * b[1]_{011k} + \quad (60)$$

$$(1 + \gamma 0) \gamma 1 \sum_{k=1}^{L} \frac{1}{Peff^k} * b[2]_{011k}$$

$$= \sum_{k=1}^{L} \frac{1}{Peff^k} * b[0]_{100k} + \gamma 0 \sum_{k=1}^{L} \frac{1}{Peff^k} * b[1]_{100k} +$$

$$(1 + \gamma 0) \gamma 1 \sum_{k=1}^{L} \frac{1}{Peff^k} * b[2]_{100k} \cdots$$

[Expression 61]

$$\gamma 0 = \frac{\alpha 1 eff}{\alpha 0 eff} \cdots \quad (61)$$

[Expression 62]

$$\gamma 1 = \frac{\alpha 2 eff}{\alpha 0 eff + \alpha 1 eff} = \frac{\alpha 2 eff}{(1 + \gamma 0) \alpha 0 eff} \cdots \quad (62)$$

Note that from Expressions (61) and (62), a relation between Expressions (63) and (64) can also be derived in regard to the weights α0eff, α1eff, and α2eff.

[Expression 63]

$$\alpha 1 eff = \gamma 0 * \alpha 0 eff \quad (63)$$

[Expression 64]

$$\alpha 2 eff = (1 + \gamma 0) * \gamma 1 * \alpha 0 eff \quad (64)$$

Referring to Expression (60), it can be seen that by using the amplification factor Peff and the weight ratio γ1 that have been derived by Expressions (54) and (58), the indefinite correction term is only the weight ratio γ0. Then, the weight ratio γ0 which should be derived by the weight ratio calculation unit 22 can be derived by searching for the weight ratio γ0 at which the left and right sides of Expression (60) match. A binary search or the like can be used for this search.

Next, calculation of the weight α in the step S16 shall be explained. The calculation in the step S16 is performed according to the result of the analog to digital conversion process in the step S15. In the step S15, in the topology of the formation 1, an analog to digital conversion process in which the common voltage Vcom having a known voltage value is input as the input signal Vin is performed. Next, when Expression (40) is solved using a result obtained in the step S15, the weight α0eff can be obtained. Further, when α0eff is obtained, the weight α1eff is obtained by Expression (63), and the weight α2eff can be obtained by Expression (64).

From the above explanation, even when the three-bit MDAC is used, by performing the rotation operation of the unit elements, a plurality of the correction coefficients can be derived by a simple calculation in a manner similar to the analog to digital converter 1 according to the first embodiment.

Third Embodiment

Figure 15:
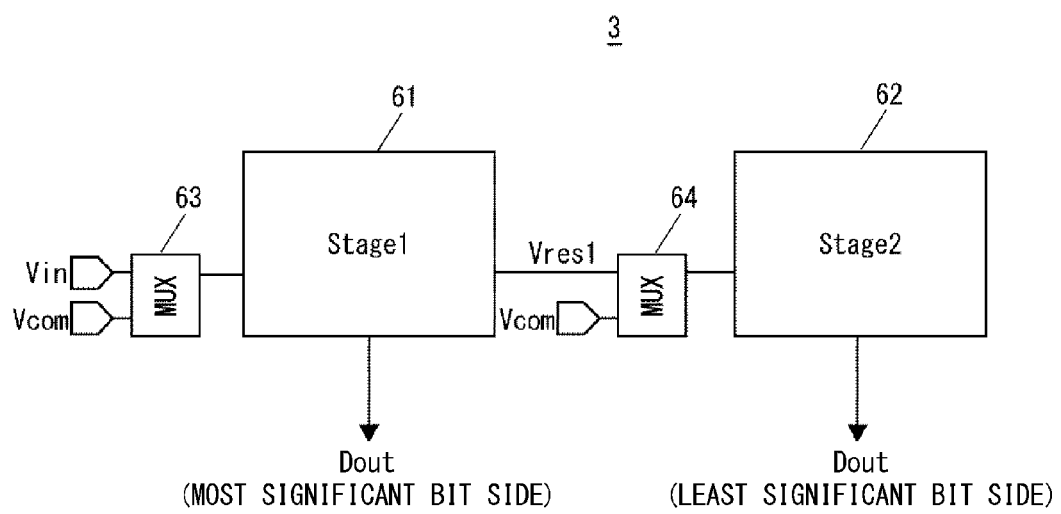
FIG. 15 is a block diagram of an analog unit of an analog to digital converter according to a third embodiment.

In a third embodiment, an example in which calibration is performed on a pipeline ADC which is comprised of cyclic ADCs connected in cascade, in which the cyclic ADC have been explained in the first and second embodiments. FIG. 15 is a block diagram of an analog to digital converter 3 according to the third embodiment.

As shown in FIG. 15, the analog to digital converter 3 according to the third embodiment includes a first stage 61, a second stage 62, and selectors 63 and 64. The analog to digital converter including the analog unit 50 according to the second embodiment shown in FIG. 9 is used as stage circuits for the first stage 61 and the second stage 62. The analog to digital converter 3 according to the third embodiment is a pipeline analog to digital converter in which two analog to digital converters are connected in cascade. Further, as shown in FIG. 15, the selector 63 switches as to whether to supply the input signal Vin or to supply the common voltage Vcom to the first stage 61. The selector 64 switches as to whether to supply the residue signal Vres of the residue amplifier 16 inside the first stage 61 or to supply the common voltage Vcom to the second stage 62.

Figure 16:
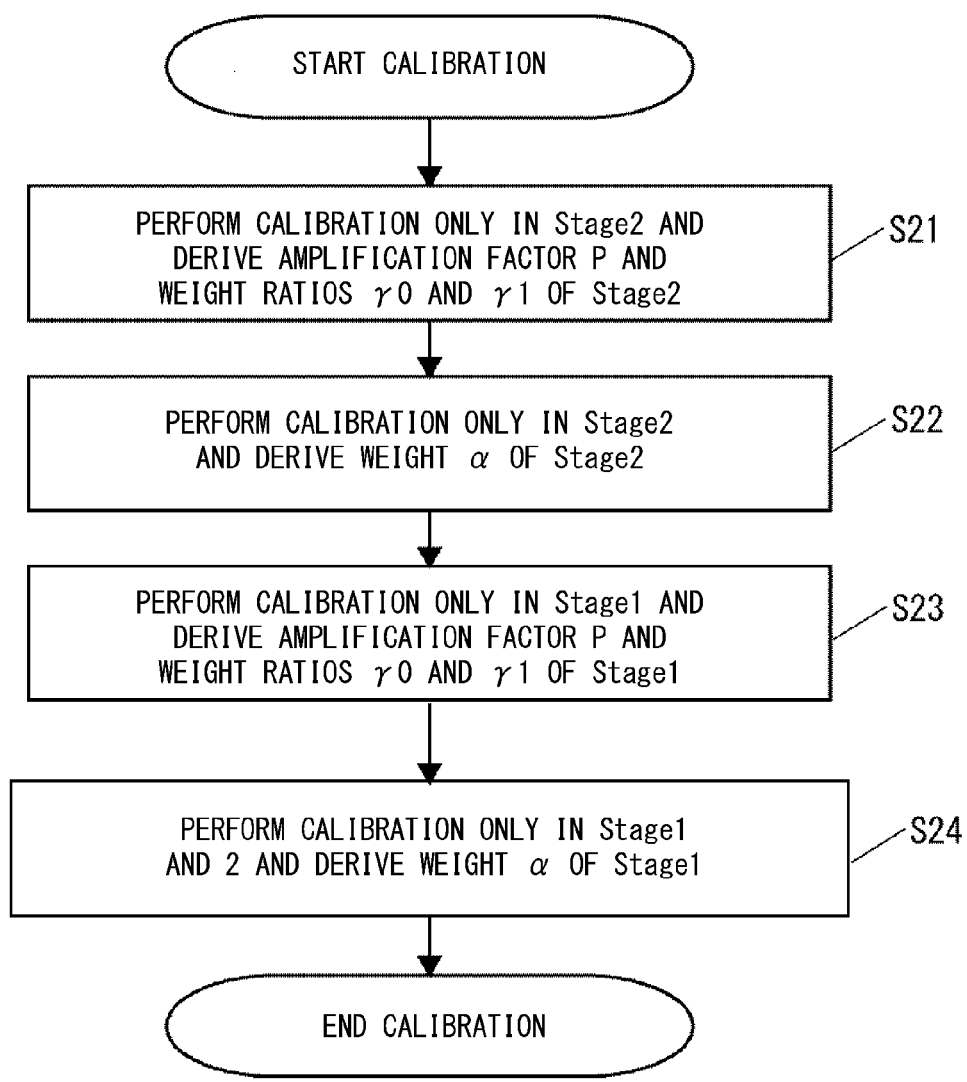
FIG. 16 is a flowchart of a calibration method of the analog to digital converter according to the third embodiment.

As the analog to digital converter including the analog unit 50 shown in FIG. 9 is used for the stage circuits, the analog to digital converter 3 according to the third embodiment can perform the calibration similar to that in the second embodiment in each stage circuit. However, calibration between the stages needs to be performed separately. FIG. 16 is a flowchart showing a procedure of the calibration method in the analog to digital converter 3 according to the third embodiment. Note that in the following explanation, although the calibration is performed under a condition that neither of the first stage 61 and the second stage 62 perform a cyclic operation, the calibration can be performed similarly even when the cyclic operation is performed.

As shown in FIG. 16, in the analog to digital converter 3 according to the third embodiment, in the steps S21 and S22, the calibration is performed on the selector 63 in the same procedure as that of the calibration method performed by the analog to digital converter according to the second embodiment which has been explained by referring to FIG. 14.

Next, in the analog to digital converter 3 according to the third embodiment, the amplification factor P and the weight ratios γ0 and γ1 of the analog unit 50 included in the first stage 61 are derived using only the first stage 61 (step S23). After that, in the analog to digital converter 3 according to the third embodiment, the calibration is performed in a state where the residue signal Vres of the first stage 61 is input to the second stage 62, and weights α0 to α2 of the first stage 61 are derived (step S24). By performing the calibration in the step S24, an inter-stage error between the first stage 61 and the second stage 62 can be corrected. This step S24 shall be explained in more detail as follows.

Figure 17:
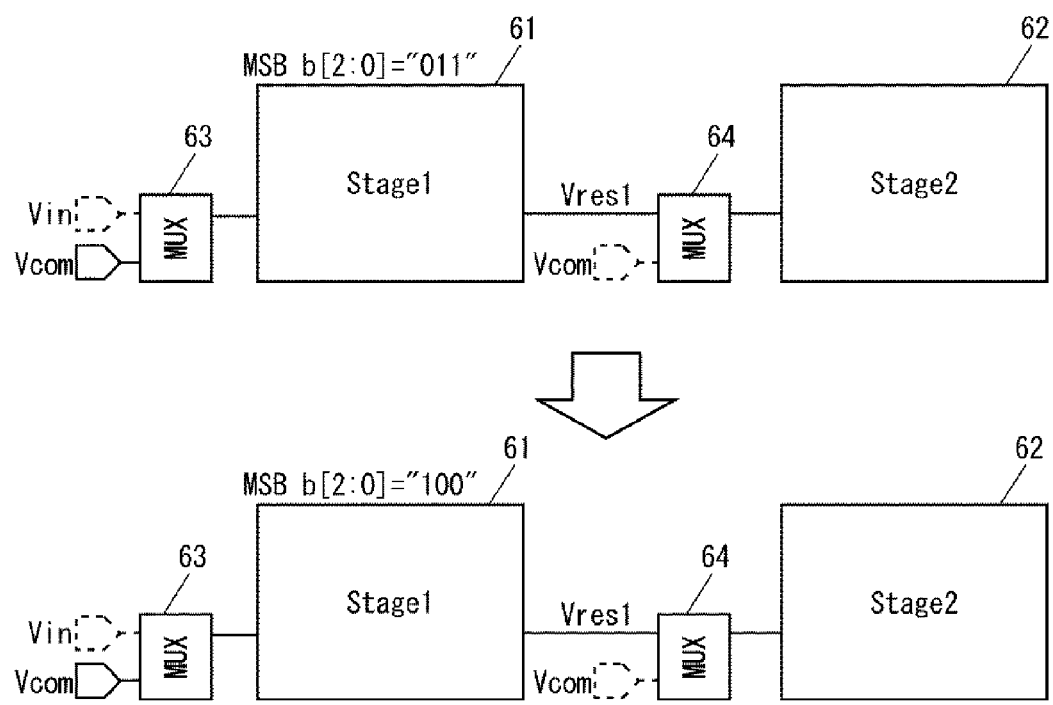
FIG. 17 is a drawing for explaining input signals and setting values of MSB when calibration is performed between stages in the calibration method of the analog to digital converter according to the third embodiment.

Firstly, FIG. 17 is a drawing for explaining input signals and setting values of MSBs when the calibration is performed between the stages in the step S24. As shown in FIG. 17, in the step S24, calibration in which an MSB of a digital intermediate value b[2:0] of the first stage 61 is fixed to "011" and calibration in which the MSB of the digital intermediate value b[2:0] of the first stage 61 is fixed to "100" is performed. At this time, the common voltage Vcom is input to the first stage 61, and a residue signal Vres1 of the first stage 61 is input to the second stage 62.

A result obtained by the calibration shown in FIG. 17 is represented by Expression (65).

[Expression 65]

$$\frac{Vin}{Vfs} = \alpha0eff\frac{1}{Peff} + \alpha0eff * \gamma0 * \frac{1}{Peff} + \qquad (65)$$

$$\alpha0eff2nd\sum_{k=1}^{L-1}\frac{1}{Peff2nd^k}b[0]_{011k} +$$

$$\alpha1eff2nd\sum_{k=1}^{L-1}\frac{1}{Peff2nd^k}b[1]_{011k}$$

$$= \alpha0eff(1 + \gamma0)\gamma1\frac{1}{Peff} + \alpha0eff2nd\sum_{k=1}^{L-1}\frac{1}{Peff2nd^k}b[0]_{011k} +$$

$$\alpha1eff2nd\sum_{k=1}^{L-1}\frac{1}{Peff2nd^k}b[1]_{100k} +$$

$$\alpha2eff2nd\sum_{k=1}^{L-1}\frac{1}{Peff2nd^k}b[2]_{100k} \ldots$$

In Expression (65), Peff, α0eff, γ0, and γ1 are parameters of the first stage 61, and Peff2nd, α0eff2nd, α1eff2nd, and α22nd are parameters of the second stage 62. Further, b[2:0] is a result of the analog to digital conversion process of the second stage 62. Among the parameters in Expression (65), as Peff, γ0, γ1, Peff2nd, α0eff2nd, α1eff2nd, and α2eff2nd have already been identified by the calibration processes in the steps S21 to S23, the indefinite correction term in Expression (65) is only α0eff. That is, when Expression (65) is solved for α0eff, the weight α0eff of the first stage 61 can be derived. In a pipeline configuration, as the inter-stage error between the first stage 61 and the second stage 62 (α0eff/α0eff2nd) will become a linearity error of the conversion result, it is necessary to highly accurately calculate the weight α0eff of the first stage 61 including this inter-stage error.

Figure 18:
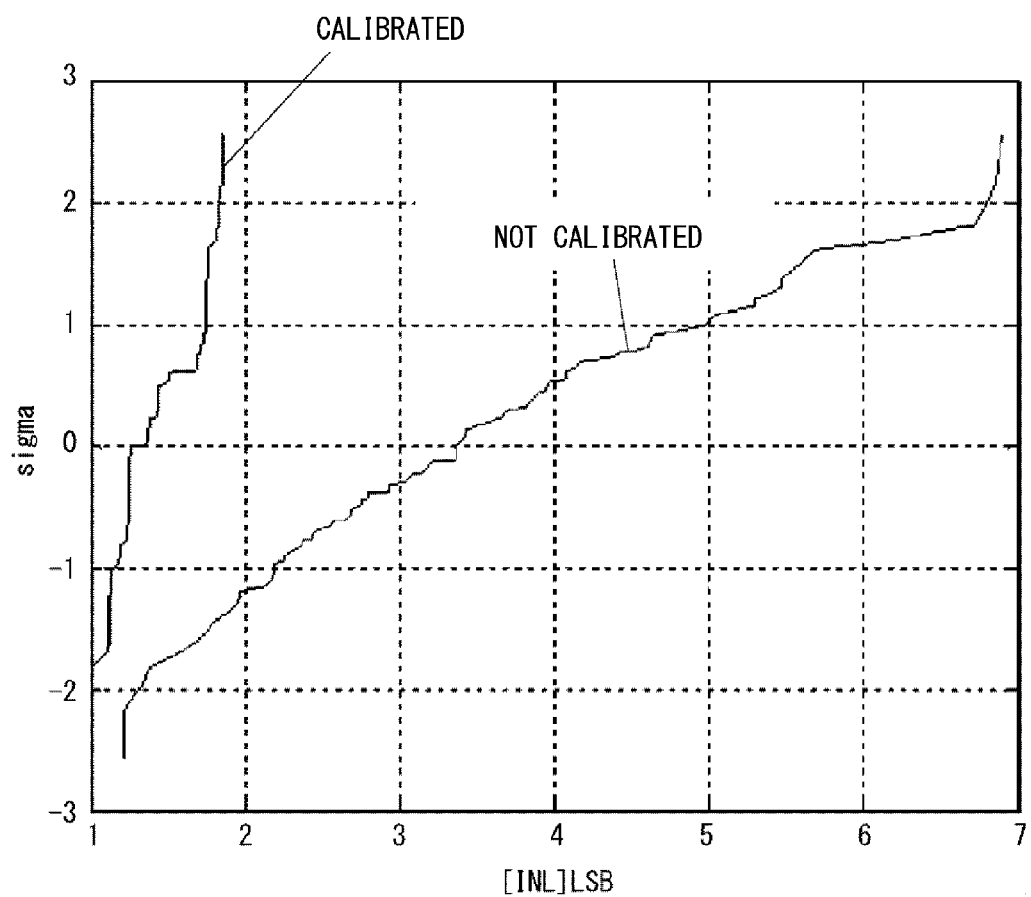
FIG. 18 is a graph for explaining an advantage when the calibration is performed on the analog to digital converter according to the third embodiment.

Next, FIG. 18 is a graph for explaining an advantage when the calibration is performed on the analog to digital converter according to the third embodiment. The graph shown in FIG. 18 is a result when the calibration of FIG. 17 is performed using numerical analysis software. In the graph of FIG. 18, the vertical axis represents a deviation of a sampling capacitor, and the horizontal axis represents INL (Integral Non-Linearity). It can be seen from FIG. 18 that when the calibration is performed, even when the variation of the sampling capacitor increases, an increase in the INL is suppressed.

From the above explanation, in the analog to digital converter 3 according to the third embodiment, by deriving the weight α of the first stage 61 including the second stage 62 which is connected to the subsequent stage, the calibration including the inter-stage error in the pipeline ADC can be performed.

Fourth Embodiment

Figure 19:
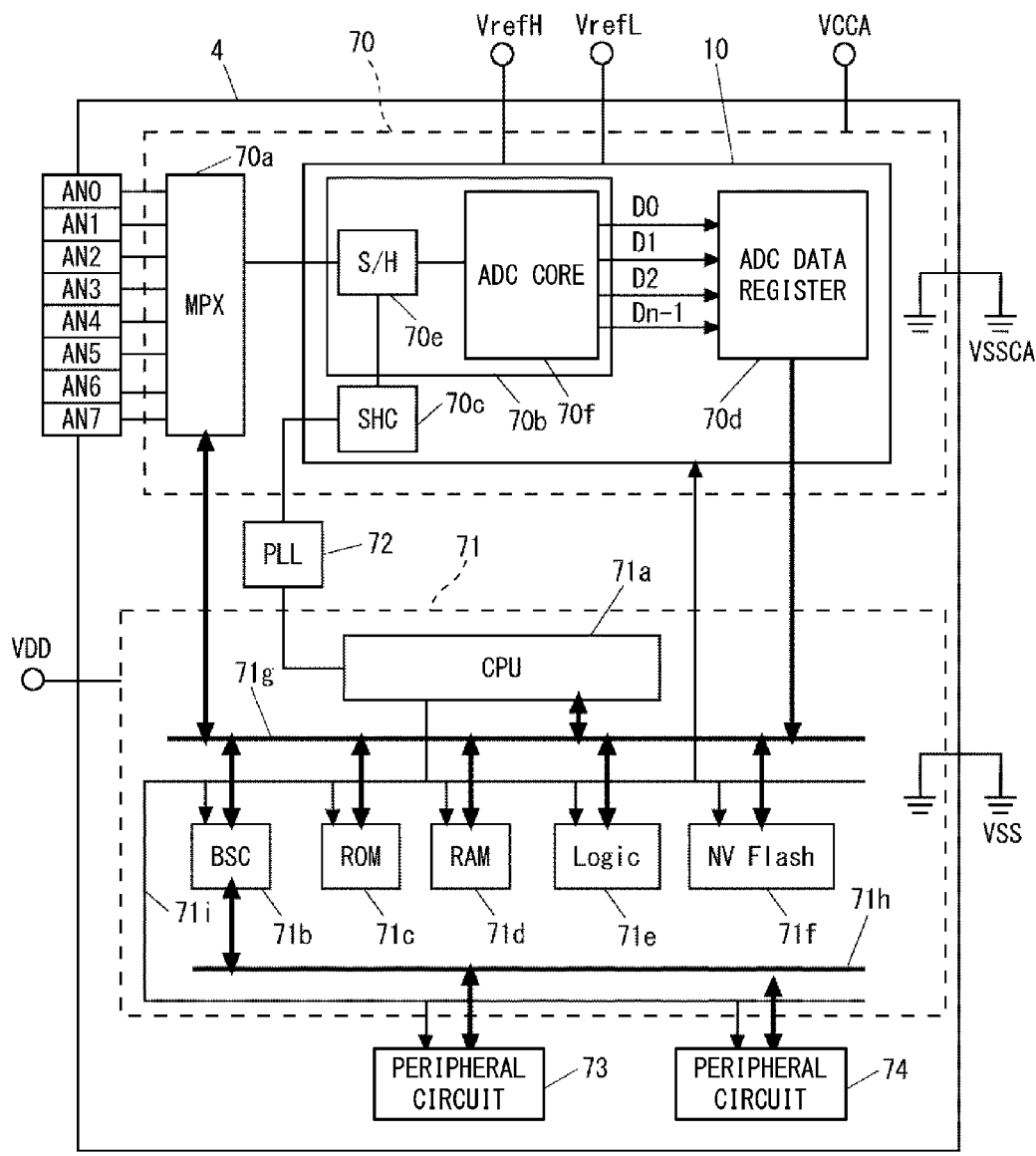
FIG. 19 is a block diagram of a semiconductor apparatus according to a fourth embodiment.

In a fourth embodiment, a processor system including the analog to digital converter that has been explained in the first to third embodiments shall be explained. FIG. 19 is a block diagram of a semiconductor apparatus 4 according to the fourth embodiment.

As shown in FIG. 19, the semiconductor apparatus 4 includes an analog unit 70, a digital unit 71, a PLL circuit 72, and peripheral circuits 73 and 74. An analog ground VSSA and an analog power supply VCCA are supplied to the analog unit 70. In addition, the high potential reference voltage VrefH and the low potential reference voltage VrefL are supplied to the analog unit 70. A digital ground VSS and a digital power supply VDD are supplied to the digital unit 71. The PLL circuit 72 generates clock signals for circuits included in the digital unit 71 and the PLL circuit 72 to operate. Functional circuits such as an input/output interface, a communication interface and the like are disposed as the peripheral circuits 73 and 74.

The analog unit 70 includes a selector 70a, an analog to digital converter 70b, a sample hold control circuit 70c, and an ADC data register 70d. Further, the analog to digital converter 70b includes a sample hold circuit 70e and an ADC core 70f. The analog to digital converter 70b is the analog to digital converter that has been explained in the first to third embodiments. Further, the sample hold control circuit 70c is the analog to digital conversion control circuit that is not shown in FIG. 1 and the like for controlling a sampling timing of the analog to digital converter 70b. The selector 70a selects one of input signals input from analog input terminals AN0 to AN7 and transmits the selected input signal to the analog to digital converter 70b. The analog to digital converter 70b, for example, outputs n-bit output data. The ADC data register 70d holds the output data output from the analog to digital converter 70b.

The digital unit 71 includes a CPU (Central Computing Unit) 71a, a bus control circuit 71b, a ROM (Read Only Memory) 71c, a RAM (Random Access Memory) 71d, a logic circuit 71e, a non-volatile memory 71f, a CPU bus 71g, a peripheral bus 71h, and a control line 71i.

The CPU 71a is an operation unit that executes a program stored in the ROM 71c, the non-volatile memory 71f or the like to perform various information processing. As one of this information processing, when the analog to digital converter 70b performs a conversion process on image information that has been input from an image sensor or the like, the CPU 71a performs image processing on the image information obtained from the analog to digital converter 70b.

The bus control circuit 71b performs an arbitration process between the CPU bus 71g and the peripheral bus 71h. The ROM 71c, the RAM 71d, the logic circuit 71e, the non-volatile memory 71f, and the peripheral circuits 73 and 74 are circuits used in the operation of the CPU 71a. The RAM 71d stores intermediate data of calculation by the CPU 71a. The logic circuit 71e is, for example, a circuit such as a timer. Further, in the analog unit 70, the CPU 71a transmits to and receives data from another circuit block using the CPU bus 71g and the peripheral bus 71h. Moreover, the CPU 71a outputs a control signal for controlling each block to the corresponding blocks using the control line 71i.

As has been explained so far, the semiconductor apparatus 4 according to the fourth embodiment includes a number of circuits other than the analog unit 70. However, the analog to digital converters according to the first to third embodiments can perform the calibration that realizes highly accurate conversion processes and also prevents the circuit size from increasing. Therefore, even when the analog to digital converters according to the first to third embodiments are embedded in a part of a large-sized circuit such as the semiconductor apparatus 4 according to the fourth embodiment, the circuit size of the entire semiconductor apparatus can be prevented from increasing. Thus, the analog to digital converters according to the first to the third embodiments are preferable for such an embedded analog to digital converter.

Fifth Embodiment

Figure 20:
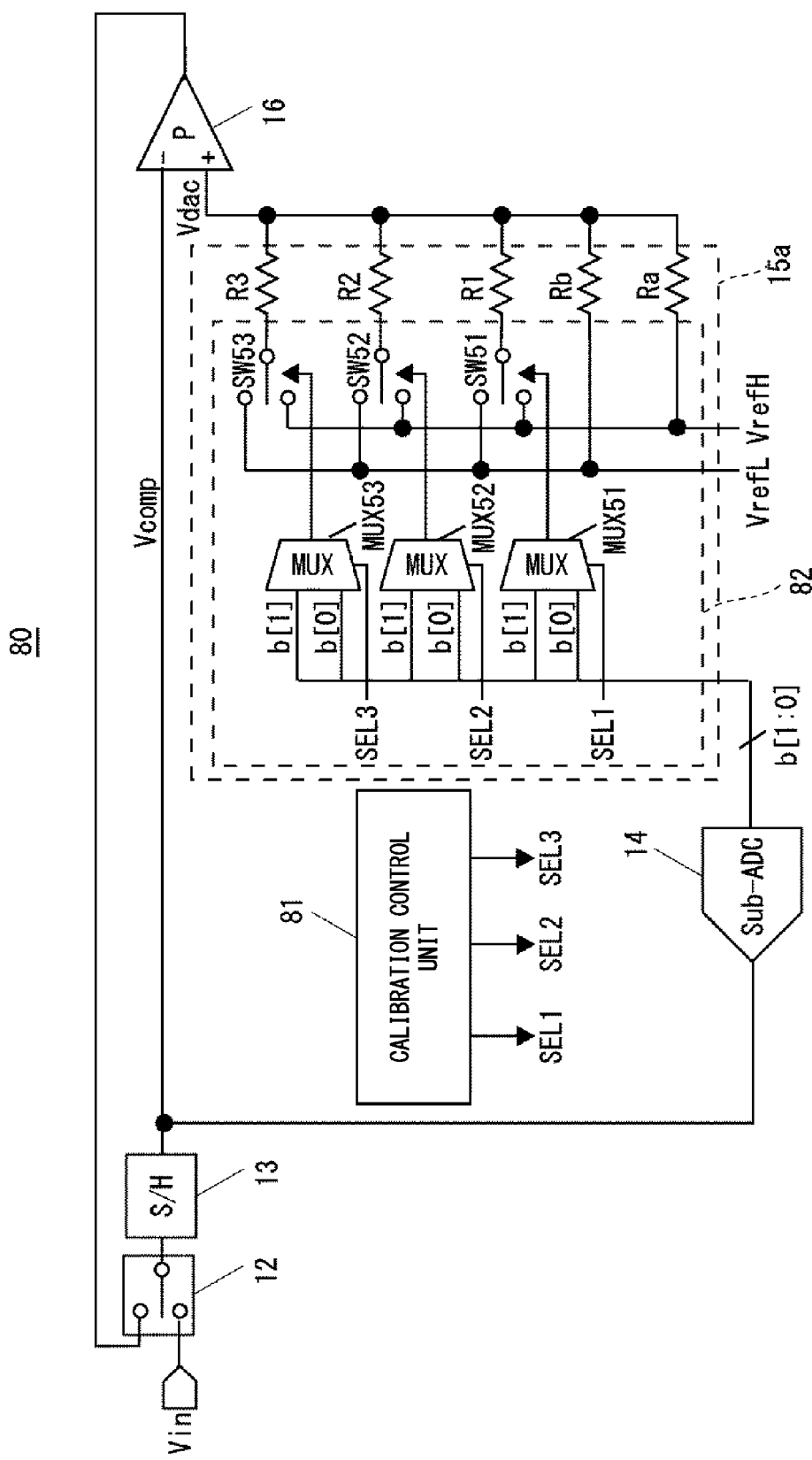
FIG. 20 is a block diagram of an analog unit of an analog to digital converter according to a fifth embodiment.

In a fifth embodiment, an analog unit 80 including a sub DAC 15a which is another form of the sub DAC 15 shall be explained. FIG. 20 is a block diagram of the analog unit 80 in an analog to digital converter according to the fifth embodiment.

As shown in FIG. 20, the sub DAC 15a is a resistor ladder DAC. This resistor ladder DAC includes resistors Ra, Rb, R1 to R3, and a corresponding bit switching unit 82. The resistor Ra is connected between a DAC output line for outputting a DAC output Vdac and a high potential reference voltage line that is supplied with the high potential reference voltage VrefH. The resistor Rb is connected between the DAC output line and a low potential reference voltage line that is supplied with the low potential reference voltage VrefL. One ends of the resistors R1 to R3 are connected to the DAC output line, and the high potential reference voltage VrefH or the low potential reference voltage VrefL is supplied to the other ends of the resistors R1 to R3 according to a bit value output from the corresponding bit switching unit 82. In the sub DAC 15a, the resistors R1 to R3 are unit elements having the same resistance value.

The corresponding bit switching unit 82 outputs the reference voltages, the number of which corresponds to a weight of a bit for each bit of a digital intermediate value and also switches the voltage of the reference voltages according to a value of each bit between the first reference voltage (e.g. the high potential reference voltage VrefH) and the second reference voltage (e.g. the low potential reference voltage VrefL). To be more specific, the corresponding bit switching unit 82 includes selectors MUX51 to MUX53 and switches SW51 to SW53. Further, the analog unit 80 according to the fifth embodiment includes a calibration control unit 81. The calibration control unit 81 outputs a selection signal switching signal for the selectors MUX51 to MUX53 to switch as to whether to select the first bit of the digital intermediate value b[0] or the second bit of the digital intermediate value b[1].

The selector MUX51 selects one of the digital intermediate value b[0] and the digital intermediate value b[1] according to the selection signal switching signal SEL1 and outputs the selected digital intermediate value to the switch SW51. The switch SW51 supplies one of the high potential reference voltage VrefH and the low potential reference voltage VrefL to the resistor R1 according to the digital intermediate value output from the selector MUX51. The selector MUX52 selects one of the digital intermediate value b[0] and the digital intermediate value b[1] according to the selection signal switching signal SEL2 and outputs the selected digital intermediate value to the switch SW52. The switch SW52 supplies one of the high potential reference voltage VrefH and the low potential reference voltage VrefL to the resistor R2 according to the digital intermediate value output from the selector MUX52. The selector MUX53 selects one of the digital intermediate value b[0] and the digital intermediate value b[1] according to the selection signal switching signal SEL3 and outputs the selected digital intermediate value to the switch SW53. The switch SW53 supplies one of the high potential reference voltage VrefH and the low potential reference voltage VrefL to the resistor R1 according to the digital intermediate value output from the selector MUX53.

Figure 21:
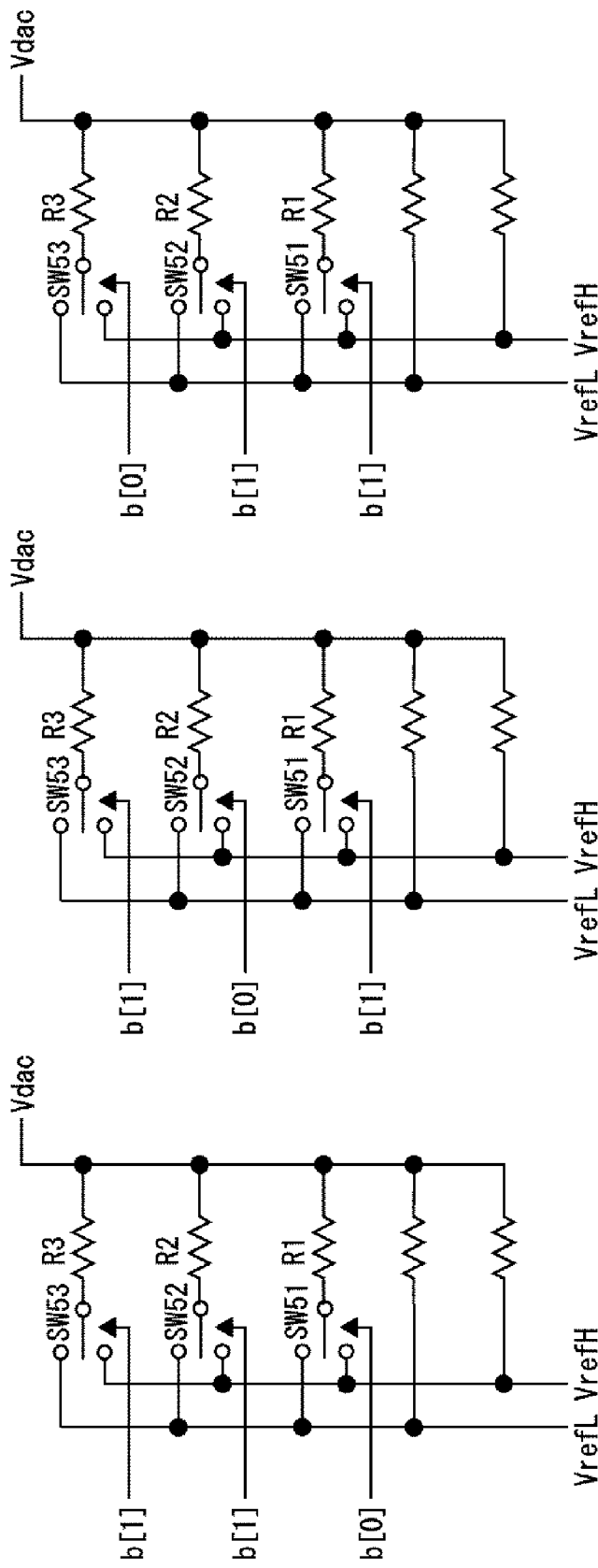
FIG. 21 is a drawing for explaining a rotation of unit elements of the analog to digital converter according to the fifth embodiment.

Then, in the analog unit 80 according to the fifth embodiment, the rotation operation is performed so that each unit element performs the digital to analog conversion process according to the reference voltage selected according to all bits of the digital intermediate value b[1:0]. To be more specific, the analog unit 80 switches the topologies of the formations 1 to 3 shown in FIG. 21 by the rotation operation.

In the formation 1, the reference voltage that is selected according to the first bit of the digital intermediate value b[0] is supplied to the resistor R1, and the reference voltage that is selected according to the second bit of the digital intermediate value b[1] is supplied to the resistors R2 and R3. The analog unit 80 operates according to the formation 1 in a normal state where no calibration operation is performed. In the formation 2, the reference voltage that is selected according to the first bit of the digital intermediate value b[0] is supplied to the resistor R2, and the reference voltage that is selected according to the second bit of the digital intermediate value b[1] is supplied to the resistors R1 and R3. In the formation 3, the reference voltage that is selected according to the first bit of the digital intermediate value b[0] is supplied to the resistor R3, and the reference voltage that is selected according to the second bit of the digital intermediate value b[1] is supplied to the resistors R1 and R2.

Also in the analog to digital converter including the analog unit 80 according to the fifth embodiment, in the calibration process, the rotation is performed on the combinations of the unit elements and the bit values for determining the reference voltage to be supplied to the unit elements. By doing so, in the analog to digital converter according to the fifth embodiment, in a manner similar to the analog to digital converter 1 according to the first embodiment, derivation of the plurality of correction coefficients can be simplified. Note that in FIG. 20, although an example in which the rotation operation is performed by the circuit of the analog method, the rotation operation can be performed by the circuit of the digital method.

Sixth Embodiment

Figure 22:
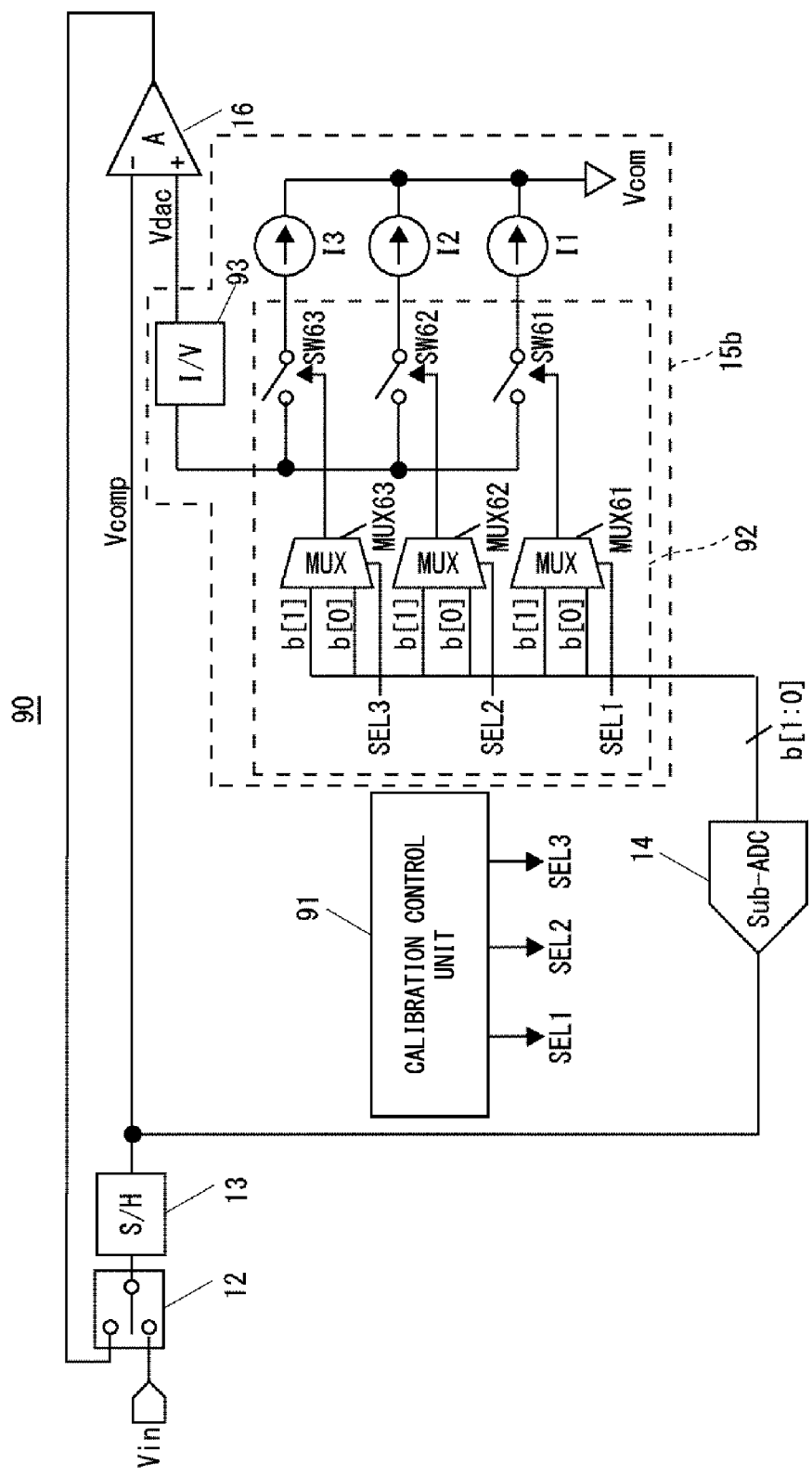
FIG. 22 is a block diagram of an analog unit of an analog to digital converter according to a sixth embodiment.

In a sixth embodiment, an analog unit 90 including a sub DAC 15b which is another mode of the sub DAC 15 shall be explained. FIG. 22 is a block diagram of the analog unit 90 in an analog to digital converter according to the sixth embodiment.

As shown in FIG. 22, the sub DAC 15b is a current switch DAC. This current switch DAC includes current sources I1 to I3, a corresponding bit switching unit 92, and a current to voltage converter 93. The current source I1 is connected a current combining line, one end of which is connected to the current to voltage converter 93. Further, a switch SW61 is connected between the current source I1 and a common voltage line to which the common voltage Vcom is supplied. One end of the current source I2 is connected to the current combining line. Further, a switch SW62 is connected between the current source I2 and the common voltage line. One end of the current source I3 is connected to the current combining line. Furthermore, a switch SW63 is connected between the current source I3 and the common voltage line. In the sub DAC 15b, the current sources I1 to I3 are unit elements having the same resistance value. The current to voltage converter 93 outputs a voltage Vdac having a voltage value corresponding to a size of a current which will be input.

The corresponding bit switching unit 92 switches the bits of the digital intermediate value based on which the current sources I1 to I3 generate an analog value. To be more specific, the corresponding bit switching unit 92 includes the selectors MUX61 to MUX63 and the switches SW61 to SW63. The analog unit 90 according to the sixth embodiment includes a calibration control unit 91. The calibration control unit 91 outputs selection signal switching signals SEL1 to SEL3 for the selectors MUX61 to MUX63 to switch as to whether to select the first bit of the digital intermediate value b[0] or to select the second bit of the digital intermediate value b[1].

The selector MUX61 selects one of the digital intermediate value b[0] and the digital intermediate value b[1] according to the selection signal switching signal SEL1 and outputs the selected digital intermediate value to the switch SW61. The switch SW61 switches as to whether or not to connect the current source I1 to the current combining line according to the digital intermediate value output from the selector MUX61. The selector MUX62 selects one of the digital intermediate value b[0] and the digital intermediate value b[1] according to the selection signal switching signal SEL2 and outputs the selected digital intermediate value to the switch SW62. The switch SW62 switches as to whether or not to connect the current source I2 to the current combining line according to the digital intermediate value output from the selector MUX62. The selector MUX63 selects one of the digital intermediate value b[0] and the digital intermediate value b[1] according to the selection signal switching signal SEL3 and outputs the selected digital intermediate value to the switch SW63. The switch SW63 switches as to whether or not to connect the current source I3 to the current combining line according to the digital intermediate value output from the selector MUX63.

Figure 23:
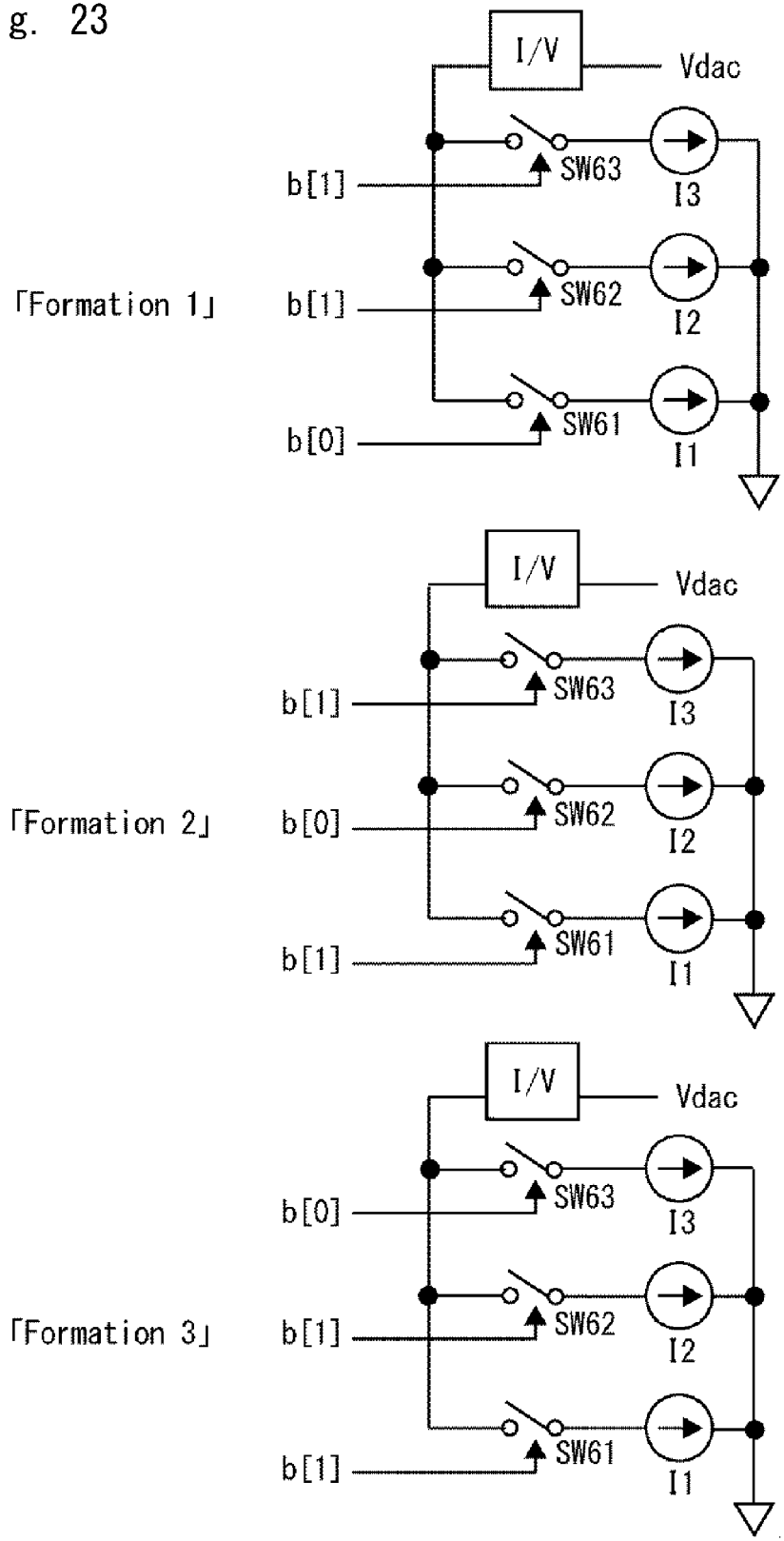
FIG. 23 is a drawing for explaining a rotation of unit elements in the analog to digital converter according to the sixth embodiment.

Then, in the analog unit 90 according to the sixth embodiment, the rotation operation is performed so that each unit element performs the digital to analog conversion process according to the reference voltage selected according to all bits of the digital intermediate value b[1:0]. To be more specific, the analog unit 90 switches the topologies of the formations 1 to 3 shown in FIG. 23 by the rotation operation.

In the formation 1, the current source I1 is switched as to whether or not the current source I1 is connected to the current combining line according to the first bit of the digital intermediate value b[0], and the current sources I2 and I3 are switched as to whether or not the current sources I2 and I3 are connected to the current combining line according to the second bit of the digital intermediate value b[1]. The analog unit 90 operates according to the formation 1 in a normal state where no calibration operation is performed. In the formation 2, the current source I2 is switched as to whether or not the current source I2 is connected to the current combining line according to the first bit of the digital intermediate value b[0], and the current sources I1 and I3 are switched as to whether or not the current sources I1 and I3 are connected to the current combining line according to the second bit of the digital intermediate value b[1]. In the formation 3, the current source I3 is switched as to whether or not the current source I3 is connected to the current combining line according to the first bit of the digital intermediate value b[0], and the current sources I1 and I2 are switched as to whether or not the current sources I1 and I2 are connected to the current combining line according to the second bit of the digital intermediate value b[1].

Also in the analog to digital converter including the analog unit 90 according to the sixth embodiment, in the calibration process, combinations of the current sources I1 to I3 and bits used by the current sources I1 to I3 to generate the analog values are switched. By doing so, in the analog to digital converter according to the sixth embodiment, in a manner similar to the analog to digital converter 1 according to the first embodiment, derivation of the plurality of correction coefficients can be simplified. Note that in FIG. 22, although an example in which the rotation operation is performed by the circuit of the analog scheme has been explained, the rotation operation can be performed by the circuit of the digital scheme.

While the invention has been described in terms of several embodiments, those skilled in the art will recognize that the invention can be practiced with various modifications within the spirit and scope of the appended claims and the invention is not limited to the examples described above.

The first to sixth embodiments can be combined as desirable by one of ordinary skill in the art.

Further, the scope of the claims is not limited by the embodiments described above.

Furthermore, it is noted that, Applicant's intent is to encompass equivalents of all claim elements, even if amended later during prosecution.

What is claimed is:

1. A semiconductor apparatus comprising:
 a sub ADC that outputs a digital intermediate value corresponding to a signal level of an input signal as a multi-bit digital value;
 a sub DAC that outputs an analog intermediate value corresponding to the digital intermediate value;
 a residue amplifier that amplifies a difference between the input signal and the analog intermediate value and outputs a residue signal; and
 an output stage circuit that outputs a digital output value, the digital output value being generated by correcting the digital intermediate value by a correction coefficient, wherein
 the sub DAC comprises:
  a plurality of unit elements, the plurality of unit elements being provided to correspond to a total number of weights for each bit of the digital intermediate value, and the same capacitance, the same resistance value, or the same current value being set to the plurality of unit elements;
  a corresponding bit switching unit that switches the bits of the digital intermediate value based on which the plurality of unit elements generate analog values; and
  a calibration control unit that switches combinations of the unit elements and the bits used by the unit elements to generate the analog value at the time of an calibration operation, and
 the output stage circuit obtains the digital intermediate value for each of the combinations of the unit elements and the bits at the time of the calibration operation and calculates the correction coefficient according to the obtained digital intermediate value.

2. The semiconductor apparatus according to claim 1, wherein
 the calibration control unit switches the combinations of the unit elements and the bits in such a way that each of the plurality of unit elements are combined with all the bits of the digital intermediate value.

3. The semiconductor apparatus according to claim 1, wherein
 the corresponding bit switching unit comprises:
  a plurality of selection circuits, the number of the plurality of selection circuits being the same as the number of the bits of the digital intermediate value, and each of the plurality of selection circuits selecting a first reference voltage and a second reference voltage according to one of the bits of the digital intermediate value and outputting the first reference voltage and the second reference voltage as a reference voltage; and a plurality of switch circuits, the number of the plurality of switch circuits being the same as the number of the plurality of unit elements, and each of the plurality of switch circuits selecting one of the reference voltages output from the plurality of selection circuits, wherein the calibration control unit outputs a switch control signal for controlling each of the switch circuits to select all of the reference voltages output from the plurality of selection circuit at least once.

4. The semiconductor apparatus according to claim 1, wherein the corresponding bit switching unit includes a selection circuit that selects a first reference voltage and a second reference voltage according to one of the bits of the digital intermediate value and outputs the first reference voltage and the second reference voltage as a reference voltage, and the number of the selection circuits is the same as the number of the unit elements, and the calibration control unit supplies the selection circuit with a selection signal switching signal for instructing the selection circuit to select the reference voltage according to all bit values from a first bit to a last bit of the digital intermediate value.

5. The semiconductor apparatus according to claim 1, wherein the sub ADC outputs, when calibration starts, a specified value that is determined to correspond to the input signal supplied at the time of the calibration and starts an operation from the specified value.

6. The semiconductor apparatus according to claim 1, wherein the sub DAC is a switched capacitor DAC, an input capacitance of the sub DAC is formed by the plurality of unit elements, and an amplifier circuit having an amplification factor that is determined according to a capacitance ratio between the input capacitance and a feedback capacitance inside a DAC constitutes the residue amplifier.

7. The semiconductor apparatus according to claim 1, wherein the sub DAC is a resistor ladder DAC, and a resistance value constituting the resistor ladder is formed by the plurality of unit elements.

8. The semiconductor apparatus according to claim 1, wherein the sub DAC is a current switch DAC, and a plurality of current sources that are provided to correspond to each bit is formed by the plurality of unit elements.

9. The semiconductor apparatus according to claim 1, further comprising:

a pipeline analog to digital converter that includes stage circuits connected in cascade, the stage circuit including the sub ADC, the sub DAC, the residue amplifier, and the output stage circuit, and an output from the residue amplifier being connected to an input of a subsequent stage circuit.

10. A method of calibrating an analog to digital converter including a sub ADC that outputs a digital intermediate value corresponding to a signal level of an input signal as a multi-bit digital value, a sub DAC that outputs an analog intermediate value corresponding to the digital intermediate value, a residue amplifier that amplifies a difference between the input signal and the analog intermediate value and outputs a residue signal, and an output stage circuit that outputs a digital output value generated by correcting the digital intermediate value by a correction coefficient, the method comprising:

switching combinations of a plurality of unit elements and bits of a digital intermediate value used by the unit elements to generate an analog value, the plurality of unit elements being provided to correspond to a total number of weights for each bit of the digital intermediate value in the sub DAC, and the same capacitance, the same resistance value, or the same current value being set to the plurality of unit elements;

performing an analog to digital conversion process on each of the combinations of the unit elements and the bits, the analog to digital conversion process using a most significant digital intermediate value corresponding to a most significant bit of a conversion result in the digital intermediate value being fixed to a previously determined value; and obtaining the digital intermediate value for each of the combinations of the unit elements and the bits and calculating the correction coefficient according to the obtained digital intermediate value.

11. The method according to claim 10, wherein in the analog to digital conversion process, two of the most significant digital intermediate values are set to each of the combinations of the unit elements and the bits, and the analog to digital conversion process using the two of the most significant digital intermediate values is performed on each of the combinations of the unit elements and the bits.

* * * * *